(12) United States Patent
Kumar et al.

(10) Patent No.: US 12,289,108 B2
(45) Date of Patent: Apr. 29, 2025

(54) CIRCUITS, DEVICES, AND METHODS FOR REDUCING FLIP-FLOP SHORT-CIRCUIT CURRENTS

(71) Applicant: Meta Platforms Technologies, LLC, Menlo Park, CA (US)

(72) Inventors: Saurabh Kumar, Portland, OR (US); Rishabh Sehgal, Austin, TX (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 189 days.

(21) Appl. No.: 18/311,259

(22) Filed: May 3, 2023

(65) Prior Publication Data

US 2024/0372540 A1    Nov. 7, 2024

(51) Int. Cl.
*H03K 3/3562*    (2006.01)
*H03K 3/012*    (2006.01)
*H03K 5/135*    (2006.01)

(52) U.S. Cl.
CPC ......... *H03K 3/35625* (2013.01); *H03K 3/012* (2013.01); *H03K 5/135* (2013.01)

(58) Field of Classification Search
CPC .................................. H03K 3/35625
USPC ....................................................... 327/203
See application file for complete search history.

(56) References Cited

U.S. PATENT DOCUMENTS

| 8,115,531 | B1* | 2/2012 | Brown | H03K 3/35625 |
| | | | | 327/202 |
| 2013/0127507 | A1* | 5/2013 | Zhuang | H03K 3/35625 |
| | | | | 327/203 |

* cited by examiner

*Primary Examiner* — Tomi Skibinski
(74) *Attorney, Agent, or Firm* — Greenberg Traurig, LLP

(57) ABSTRACT

A circuit may include (1) an external input, (2) an external output, (3) a flip-flop subcircuit including (A) a first sequential subcircuit for reading data-input signals from the external input, the first sequential subcircuit including a first internal input coupled to the external input and a first internal output and (B) a second sequential subcircuit for outputting data-output signals to the external output, the second sequential subcircuit including a second internal input coupled to the first internal output of the first sequential subcircuit and a second internal output coupled to the external output, and (4) a hysteresis subcircuit coupled to the external output and configured to reduce a short-circuit current of the circuit. Various other devices, systems, and methods are also disclosed.

20 Claims, 17 Drawing Sheets

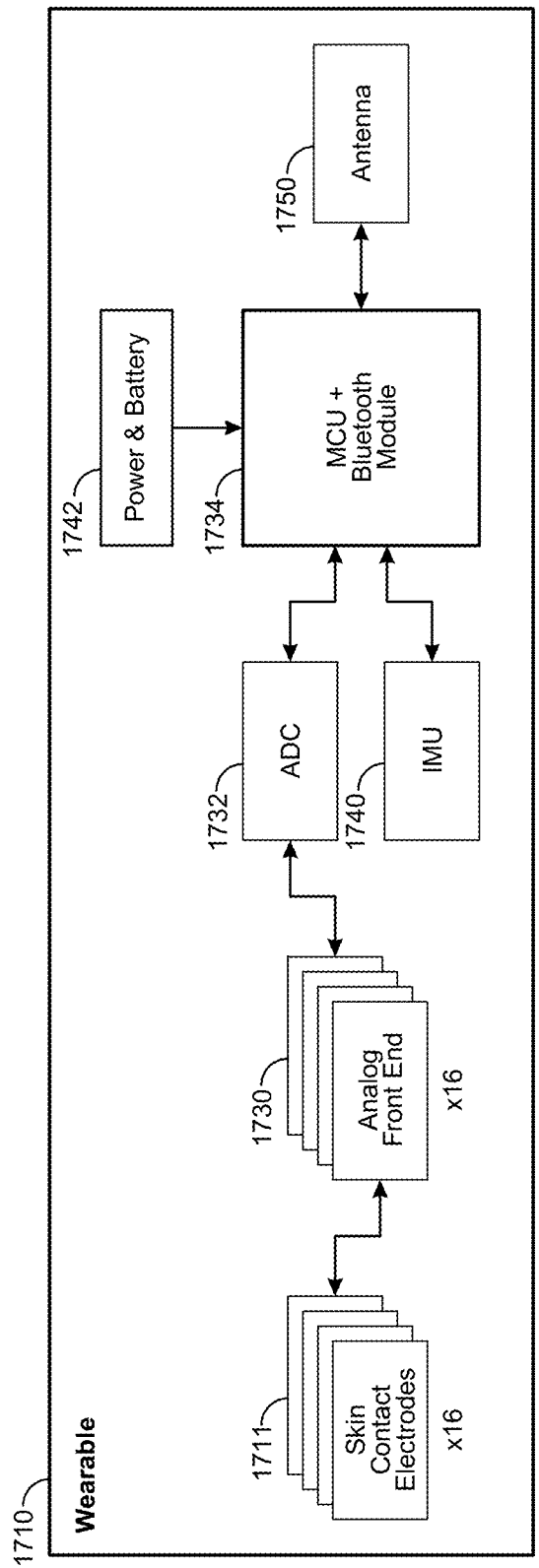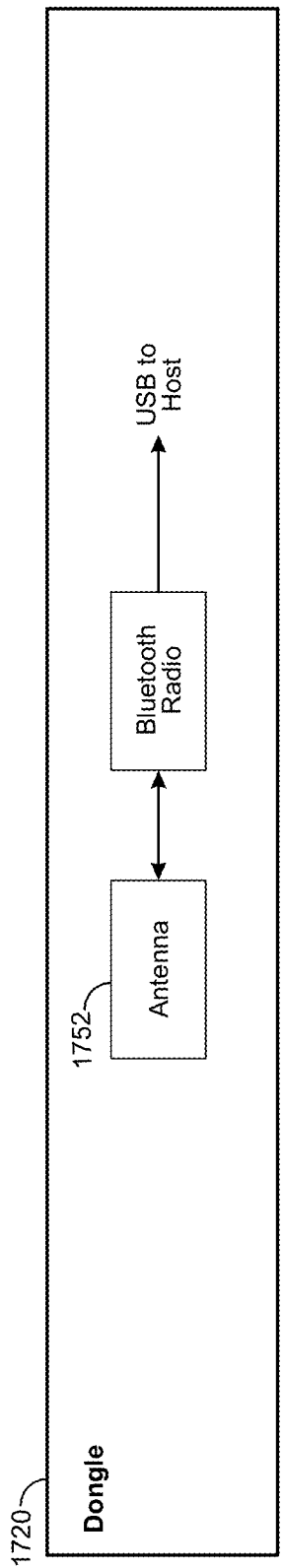
FIG. 17A
FIG. 17B

CIRCUITS, DEVICES, AND METHODS FOR REDUCING FLIP-FLOP SHORT-CIRCUIT CURRENTS

BRIEF DESCRIPTION OF THE DRAWINGS

The accompanying drawings illustrate a number of exemplary embodiments and are a part of the specification. Together with the following description, these drawings demonstrate and explain various principles of the present disclosure.

FIGS. 17A and 17B are illustrations of an exemplary schematic diagram with internal components of a wearable system.

Figure 1:
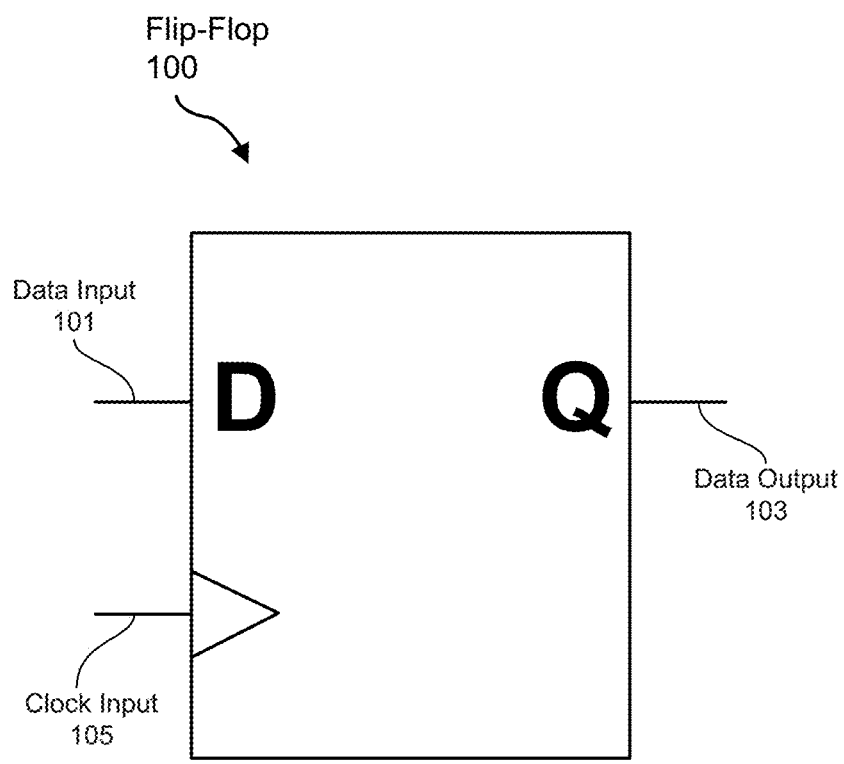
FIG. 1 is a diagram of an exemplary low-power flip-flop according to one or more implementations of this disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXAMPLE EMBODIMENTS

The present disclosure is generally directed to circuits, devices, and methods for reducing flip-flop short-circuit currents. As will be explained in greater detail below, embodiments of the present disclosure may include a hysteresis subcircuit, coupled to the output of a flip-flop subcircuit (e.g., a standard flip-flop cell) and controlled by an internal node of the flip-flop subcircuit, that creates a hysteresis between low-to-high transitions and high-to-low transitions of the output of the flip-flop subcircuit. In some examples, one or more of the hysteresis subcircuits disclosed herein may substantially reduce short-subcircuit currents, and any associated power dissipations or losses, experienced by the flip-flop subcircuit. In some examples, one or more of the hysteresis subcircuits disclosed herein may additionally or alternatively improve minimum timing delays and may thus be especially suited for use in minimum delay or minimum timing sensitive paths. Embodiments of the present disclosure may enable chip designers to more easily reach various high-level design objectives such as power, performance, and full-chip area (PPA) targets. Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-8, detailed descriptions of example flip-flop circuits, apparatus, systems, and methods. With reference to FIGS. 9-17, the following will provide detailed descriptions of various systems and components that may implement embodiments of the present disclosure.

FIG. 1 illustrates an example flip-flop 100 having multiple external inputs and/or outputs. In some examples, flip-flop 100 may represent or include a one-bit memory device whose output state may be changed by various input signals applied to its inputs such as a d-type flip-flop, a t-type flip-flop, a jk-type flip-flop, portions of one or more of the same, variations or combinations of one or more of the same, and/or any other suitable device. In some examples, flip-flop 100 may represent or include a master-slave flip-flop (e.g., built from two back-to-back sequential elements such as latches). In some examples, flip-flop 100 may represent or include an edge-triggered memory device whose output state changes on a clock edge. In at least one example, flip-flop 100 may represent or include a positive-edge triggered, static or quasi-static d-type flip-flop. In the example illustrated in FIG. 1, flip-flop 100 may include an external data input 101, an external data output 103, and an external clock input 105. In some examples, flip-flop 100 may be configured to sample a state of a signal at external data input 101, issue the sampled state at external output 103, and/or store the sampled state until it is replaced by another.

Figure 2:
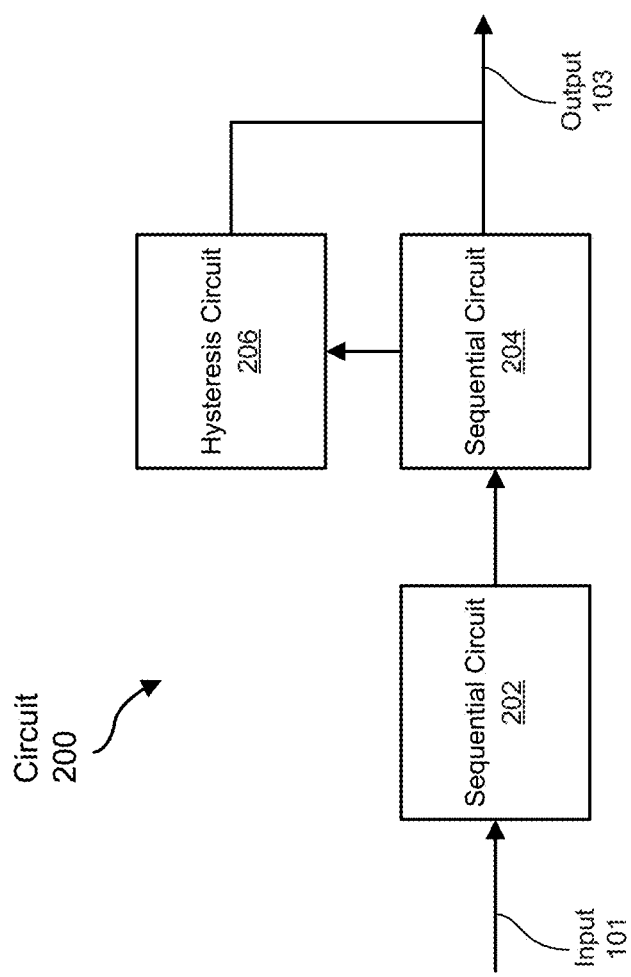
FIG. 2 is a diagram of an exemplary low-power flip-flop circuit according to one or more implementations of this disclosure.

Example flip-flop 100 may be implemented in a variety of ways. FIGS. 2, 3, 4, and 5 illustrate example configurations of flip-flop 100. FIG. 2 illustrates an example circuit 200. In some examples, example circuit 200 may represent or include all or a portion of flip-flop 100 in FIG. 1. As shown, circuit 200 may include a sequential circuit 202, a sequential circuit 204, and a hysteresis circuit 206. In this example, external input 101 may be coupled to an input of sequential circuit 202, an output of sequential circuit 202 may be coupled to an input of sequential circuit 204, a data output of sequential circuit 204 and an output of hysteresis circuit 206 may be coupled to external output 103, and a control output of sequential circuit 204 may be coupled to an input of hysteresis circuit 206. While not shown, one or more of sequential circuit 202, sequential circuit 204, and hysteresis circuit 206 may additionally be coupled to external clock input 105.

In some examples, sequential circuit 202 and/or sequential circuit 204 may represent or include a digital circuit that changes state according to one or more input signals. In some examples, sequential circuit 202 and/or sequential circuit 204 may represent or include a two-state subcircuit that represents or includes a feedback loop configured to sample a state at its input and then retain the state at its output. For example, sequential circuit 202 may be configured to read or otherwise sample a state of a data-input signal present at external data input 101 and retain the read or sampled state at an internal output of sequential circuit 202, and sequential circuit 204 may be configured to read or otherwise sample a state of a data-input signal present at the internal output of sequential circuit 202 and retain the read or sampled state at external data output 103. In some examples, sequential circuit 202 and/or sequential circuit 204 may be configured to change states based on or responsive to a clock or enable signal. In at least one example, sequential circuit 202 and/or sequential circuit 204 may be configured to change states at different moments in time based on or responsive to a clock or enable signal. In some examples, hysteresis circuit 206 may be configured to exhibit hysteresis or lag and/or may be configured to contribute to transition hysteresis or lag at or on external data output 103, which may reduce short-circuit currents experienced by at least sequential circuit 204. In at least one example, hysteresis circuit 206 may include, represent, and/or be based on a Schmidt trigger.

Figure 3:
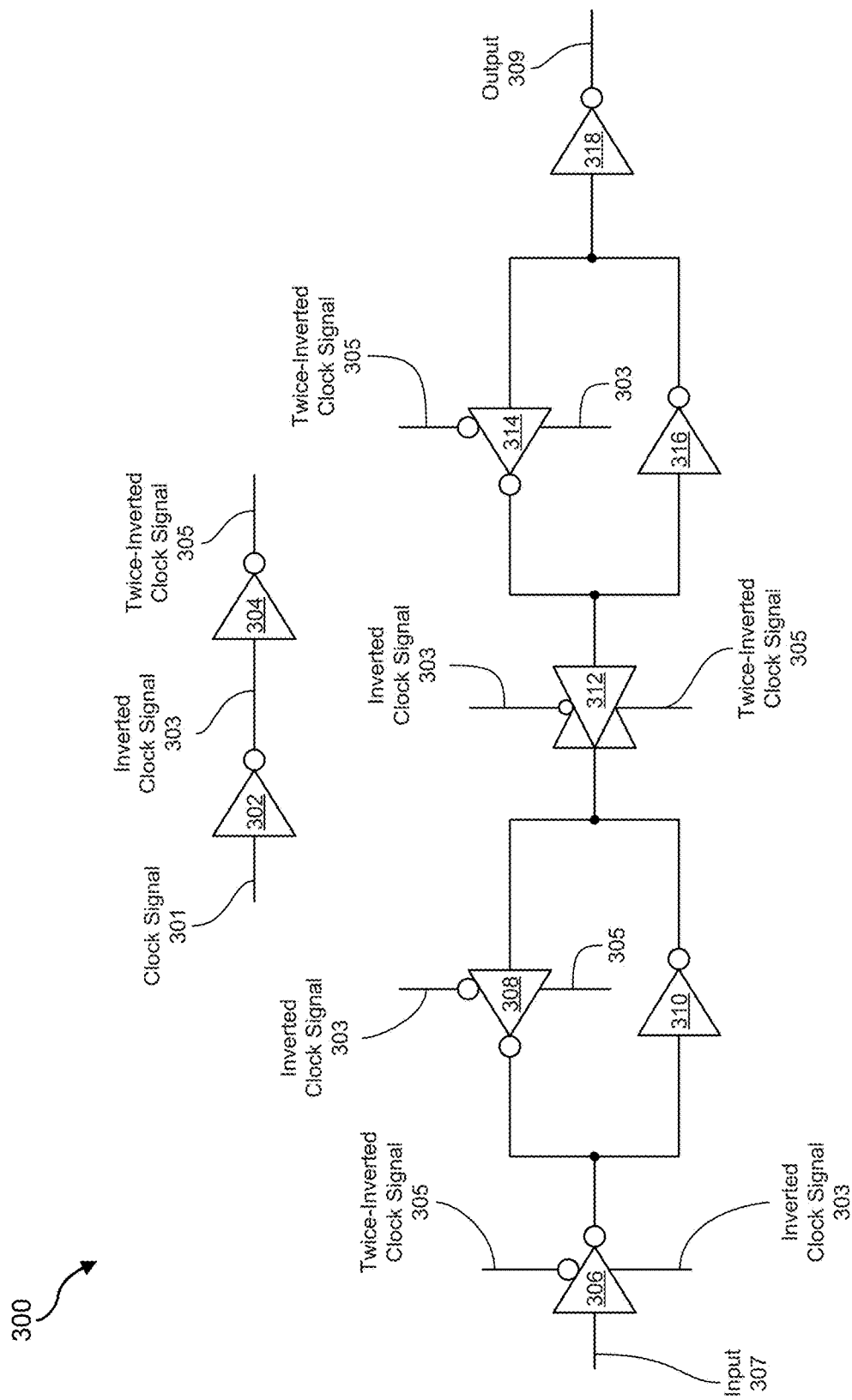
FIG. 3 is a diagram of another exemplary low-power flip-flop circuit according to one or more implementations of this disclosure.

FIG. 3 illustrates an example circuit 300. In some examples, example circuit 300 may represent or include all or a portion of flip-flop 100 in FIG. 1 and/or all or a portion of circuit 200 in FIG. 2. As shown, circuit 300 may include an inverter 302, an inverter 304, a clocked inverter 306, a clocked inverter 308, an inverter 310, a transmission gate 312, a clocked inverter 314, an inverter 316, and an inverter 318. In this example, a clock signal 301 may represent or include an input of inverter 302, an inverted clock signal 303 may represent or include an output of inverter 302 and an input of inverter 304, and a twice-inverted clock signal 305 may represent an output of inverter 304. In at least one example, clock signal 301 may represent a signal at clock input 105 of flip-flop 100 in FIG. 1. In some examples, an input signal 307 may represent or include an input of clocked inverter 306, and an output signal 309 may represent an output of inverter 318. In at least one example, input signal 307 may represent a signal at data input 101 of flip-flop 100 in FIG. 1, and output signal 309 may represent a signal at data output 103 of flip-flop 100 in FIG. 1. In some examples, clocked inverter 306, inverter 310, clocked inverter 308, and their associated interconnections may represent some or all of sequential circuit 202 in FIG. 2, and transmission gate 312, inverter 316, clocked inverter 314, inverter 318, and their associated interconnections may represent some or all of sequential circuit 204 in FIG. 2.

As shown in FIG. 3, an output of clocked inverter 306 may be coupled to an input of inverter 310 and an output of clocked inverter 308, an output of inverter 310 may be coupled to an input of clocked inverter 308 and an input of transmission gate 312, an output of transmission gate 312 may be coupled to an input of inverter 316 and an output of clocked inverter 314, and an output of inverter 316 may be coupled to an input of clocked inverter 314 and an input of inverter 318.

In some examples, one or more of clock signal 301, inverted clock signal 303, and/or twice-inverted clock signal 305 may be used to clock or enable one or more of the clocked elements of circuit 300. In some examples, inverted clock signal 303 may be coupled to a positive clock or enable input of clocked inverter 306, and twice-inverted clock signal 305 may be coupled to a negative clock or enable input of clocked inverter 306. As such, clocked inverter 306 may be configured to act as an inverter when clock signal 301 is low and a high impedance or an open circuit when clock signal 301 is high. In some examples, inverted clock signal 303 may be coupled to a negative clock or enable input of clocked inverter 308, and twice-inverted clock signal 305 may be coupled to a positive clock or enable input of clocked inverter 308. As such, clocked inverter 308 may be configured to act as an inverter when clock signal 301 is high and a high impedance or an open circuit when clock signal 301 is low. In some examples, inverted clock signal 303 may be coupled to a negative clock or enable input of transmission gate 312, and twice-inverted clock signal 305 may be coupled to a positive clock or enable input of transmission gate 312. As such, transmission gate 312 may be configured to act as a closed circuit when clock signal 301 is high and a high impedance or an open circuit when clock signal 301 is low. In some examples, inverted clock signal 303 may be coupled to a positive clock or enable input of clocked inverter 314, and twice-inverted clock signal 305 may be coupled to a negative clock or enable input of clocked inverter 314. As such, clocked inverter 314 may be configured to act as an inverter when clock signal 301 is low and a high impedance or an open circuit when clock signal 301 is high.

When clock signal 301 is low, clocked inverter 306 may be enabled such that the output of inverter 310 follows or mirrors input signal 307, clocked inverter 308 may be disabled, and transmission gate 312 may be disabled such that the output of inverter 310 is disconnected from the input of inverter 316. Meanwhile, clocked inverter 314 may be enabled creating a feedback loop with inverter 316, and the feedback loop may store a previous value of the output of inverter 310 (e.g., a value before clock signal 301 went low). When clock signal 301 goes high, clocked inverter 306 may be disabled, and clocked inverter 308 may be enabled and may create a feedback loop with inverter 310 such that the last value of input signal 307 before clock signal 301 went high is stored by the feedback loop made up of clocked inverter 308 and inverter 310. When clock signal 301 goes high, transmission gate 312 may also be enabled, and clocked inverter 314 may be disabled such that the output of inverter 318 follows the output of inverter 310, which corresponds to the value stored by the feedback loop made up of clocked inverter 308 and inverter 310. When clock signal 301 again goes low, transmission gate 312 may be disabled such that the output of inverter 310 is no longer connected to the input of inverter 316. However, clocked inverter 314 may be reenabled such that the feedback loop made up of clocked inverter 314 and inverter 316 is restored to store the previous value of the output of inverter 310 before clock signal 301 went low again.

Figure 4:
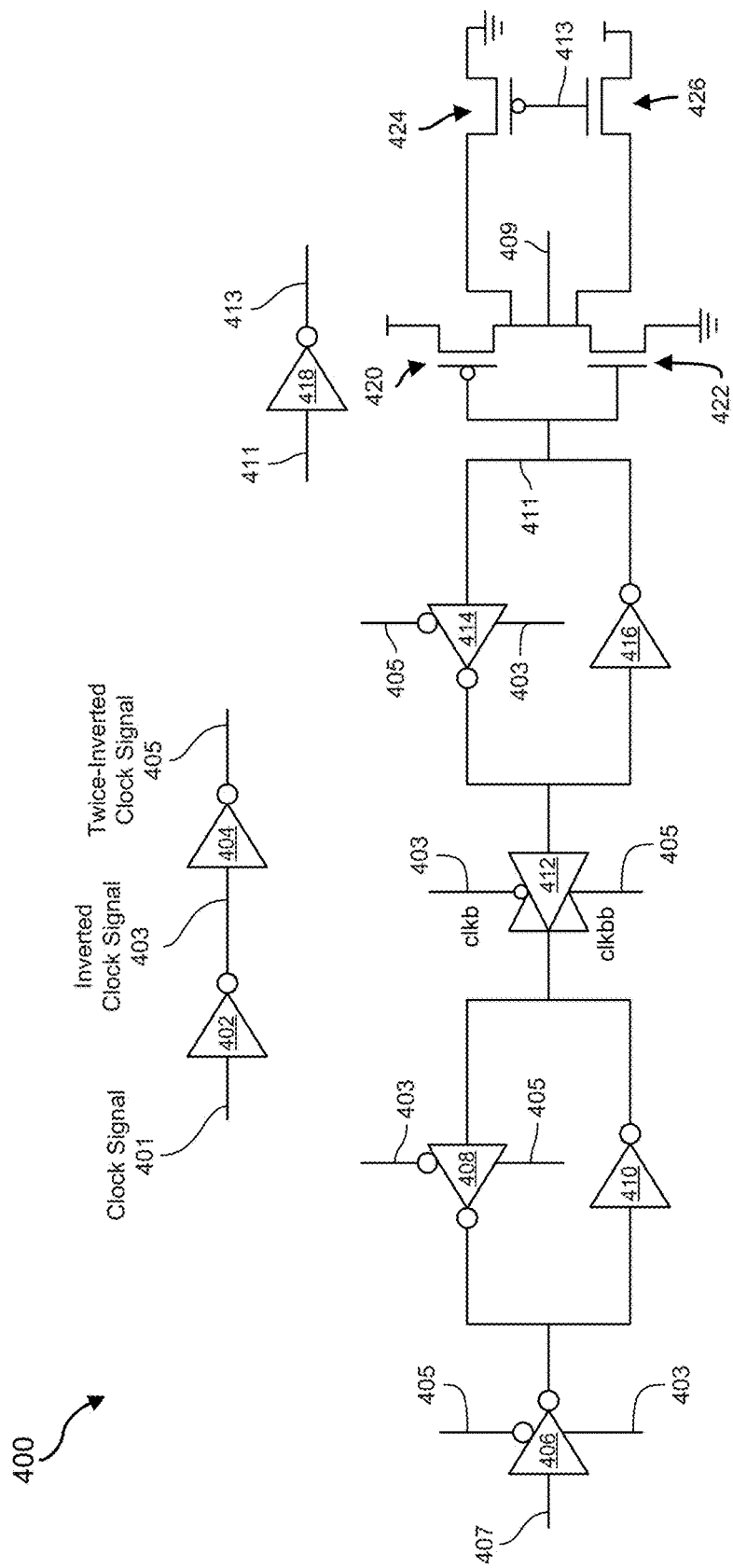
FIG. 4 is a diagram of another exemplary low-power flip-flop circuit according to one or more implementations of this disclosure.

FIG. 4 illustrates an example circuit 400. In some examples, example circuit 400 may represent or include all or a portion of flip-flop 100 in FIG. 1, all or a portion of circuit 200 in FIG. 2, and/or all or a portion of circuit 300 in FIG. 3. As shown, circuit 400 may include an inverter 402, an inverter 404, a clocked inverter 406, a clocked inverter 408, an inverter 410, a transmission gate 412, a clocked inverter 414, an inverter 416, an inverter 418, a p-type transistor 420, an n-type transistor 422, a p-type transistor 424, and an n-type transistor 426. In this example, a clock signal 401 may represent or include an input of inverter 402, an inverted clock signal 403 may represent or include an output of inverter 402 and an input of inverter 404, and a twice-inverted clock signal 405 may represent an output of inverter 404. In at least one example, clock signal 401 may represent a signal at clock input 105 of flip-flop 100 in FIG. 1.

In some examples, an input signal 407 may represent or include an input of clocked inverter 406, and an output signal 409 may represent an output signal at a node of circuit 400 that is coupled to a drain of p-type transistor 420, a drain of n-type transistor 422, a source of p-type transistor 424, and a source of n-type transistor 426. In at least one example, input signal 407 may represent a signal at data input 101 of flip-flop 100 in FIG. 1, and output signal 409 may represent a signal at data output 103 of flip-flop 100 in FIG. 1. In some examples, clocked inverter 406, inverter 410, clocked inverter 408, and their associated interconnections may represent some or all of sequential circuit 202 in FIG. 2. Additionally or alternatively, transmission gate 412, inverter 416, clocked inverter 414, p-type transistor 420, n-type transistor 422, and their associated interconnections may represent some or all of sequential circuit 204 in FIG. 2, and inverter 418, p-type transistor 424, n-type transistor 426, and their associated interconnections may represent some or all of hysteresis circuit 206 in FIG. 2.

As shown in FIG. 4, an output of clocked inverter 406 may be coupled to an input of inverter 410 and an output of clocked inverter 408, an output of inverter 410 may be coupled to an input of clocked inverter 408 and an input of transmission gate 412, an output of transmission gate 412 may be coupled to an input of inverter 416 and an output of clocked inverter 414, and an output of inverter 416 may be coupled to an input of clocked inverter 414, an input of inverter 418, a gate of p-type transistor 420, and a gate of n-type transistor 422. In this example, an output 413 of inverter 418 may be coupled to gates of p-type transistor 424 and n-type transistor 426.

In some examples, one or more of clock signal 401, inverted clock signal 403, and/or twice-inverted clock signal 405 may be used to clock or enable one or more of the clocked elements of circuit 400. In some examples, inverted clock signal 403 may be coupled to a positive clock or enable input of clocked inverter 406, and twice-inverted clock signal 405 may be coupled to a negative clock or enable input of clocked inverter 406. As such, clocked inverter 406 may be configured to act as an inverter when clock signal 401 is low and a high impedance or an open circuit when clock signal 401 is high. In some examples, inverted clock signal 403 may be coupled to a negative clock or enable input of clocked inverter 408, and twice-inverted clock signal 405 may be coupled to a positive clock or enable input of clocked inverter 408. As such, clocked inverter 408 may be configured to act as an inverter when clock signal 401 is high and a high impedance or an open circuit when clock signal 401 is low. In some examples, inverted clock signal 403 may be coupled to a negative clock or enable input of transmission gate 412, and twice-inverted clock signal 405 may be coupled to a positive clock or enable input of transmission gate 412. As such, transmission gate 412 may be configured to act as a closed circuit when clock signal 401 is high and a high impedance or an open circuit when clock signal 401 is low. In some examples, inverted clock signal 403 may be coupled to a positive clock or enable input of clocked inverter 414, and twice-inverted clock signal 405 may be coupled to a negative clock or enable input of clocked inverter 414. As such, clocked inverter 414 may be configured to act as an inverter when clock signal 401 is low and a high impedance or an open circuit when clock signal 401 is high.

When clock signal 401 is low, clocked inverter 406 may be enabled such that the output of inverter 410 follows or mirrors input signal 407, clocked inverter 408 may be disabled, and transmission gate 412 may be disabled such that the output of inverter 410 is disconnected from the input of inverter 416. Meanwhile, clocked inverter 414 may be enabled creating a feedback loop with inverter 416, and the feedback loop may store a previous value of the output of inverter 410 (e.g., a value before clock signal 401 went low). When clock signal 401 goes high, clocked inverter 406 may be disabled, and clocked inverter 408 may be enabled and may create a feedback loop with inverter 410 such that the last value of input signal 407 before clock signal 401 went high is stored by the feedback loop made up of clocked inverter 408 and inverter 410. When clock signal 401 goes high, transmission gate 412 may also be enabled, and clocked inverter 414 may be disabled such that the output of an inverter made up of a p-type transistor 420 and an n-type transistor 422 follows the output of inverter 410, which corresponds to the value stored by the feedback loop made up of clocked inverter 408 and inverter 410. When clock signal 401 again goes low, transmission gate 412 may be disabled such that the output of inverter 410 is no longer connected to the input of inverter 416. However, clocked inverter 414 may be reenabled such that the feedback loop made up of clocked inverter 414 and inverter 416 is restored to store the previous value of the output of inverter 410 before clock signal 401 went low again.

In this example, when an output signal 411 of inverter 416 is low, a corresponding output signal 413 of inverter 418 may be high, p-type transistor 420 may be in saturation, and n-type transistor 422 may be off. Moreover, when output signal 413 is high, p-type transistor 424 may be off, and n-type transistor 426 may be saturated. The various states of p-type transistor 420, n-type transistor 422, p-type transistor 424, and n-type transistor 426 when output signal 411 is low may cause output signal 409 to be high. On the other hand, when output signal 411 of inverter 416 is high, corresponding output signal 413 of inverter 418 may be low, p-type transistor 420 may be off, and n-type transistor 422 may be in saturation. Moreover, when output signal 413 is low, p-type transistor 424 may be in saturation, and n-type transistor 426 may be off. The various states of p-type transistor 420, n-type transistor 422, p-type transistor 424, and n-type transistor 426 when output signal 411 is high may cause output signal 409 to be low. In some examples, the inclusion of inverter 418, p-type transistor 424, n-type transistor 426, and their associated interconnections may cause hysteresis in circuit 400 and/or one or more of the transistors of circuit 400 to spend less time being driven in its triode, linear, or ohmic mode or region.

Figure 5:
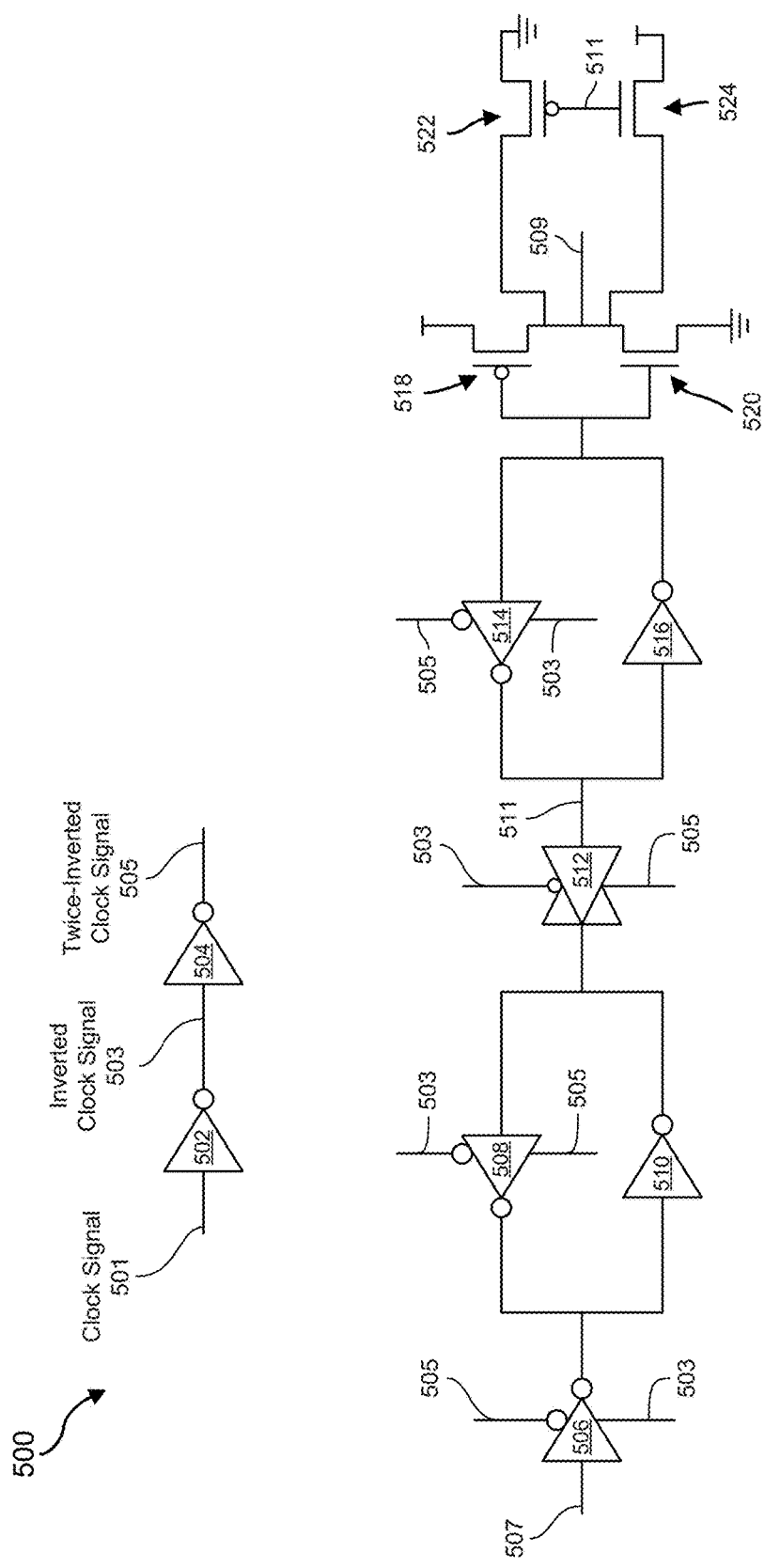
FIG. 5 is a diagram of another exemplary low-power flip-flop circuit according to one or more implementations of this disclosure.

FIG. 5 illustrates an example circuit 500. In some examples, example circuit 500 may represent or include all or a portion of flip-flop 100 in FIG. 1, all or a portion of circuit 200 in FIG. 2, all or a portion of circuit 300 in FIG. 3, and/or all or a portion of circuit 400 in FIG. 4. As shown, circuit 500 may include an inverter 502, an inverter 504, a clocked inverter 506, a clocked inverter 508, an inverter 510, a transmission gate 512, a clocked inverter 514, an inverter 516, a p-type transistor 518, an n-type transistor 520, a p-type transistor 522, and an n-type transistor 524. In this example, a clock signal 501 may represent or include an input of inverter 502, an inverted clock signal 503 may represent or include an output of inverter 502 and an input of inverter 504, and a twice-inverted clock signal 505 may represent an output of inverter 504. In at least one example, clock signal 501 may represent a signal at clock input 105 of flip-flop 100 in FIG. 1.

In some examples, an input signal 507 may represent or include an input of clocked inverter 506, and an output signal 509 may represent an output signal at a node of circuit 500 that is coupled to a drain of p-type transistor 518, a drain of n-type transistor 520, a source of p-type transistor 522, and a source of n-type transistor 524. In at least one example, input signal 507 may represent a signal at data input 101 of flip-flop 100 in FIG. 1, and output signal 509 may represent a signal at data output 103 of flip-flop 100 in FIG. 1. In some examples, clocked inverter 506, inverter 510, clocked inverter 508, and their associated interconnections may represent some or all of sequential circuit 202 in FIG. 2, transmission gate 512, inverter 516, clocked inverter 514, p-type transistor 518, n-type transistor 520, and their associated interconnections may represent some or all of sequential circuit 204 in FIG. 2, and p-type transistor 522, n-type transistor 524, and their associated interconnections may represent some or all of hysteresis circuit 206 in FIG. 2.

As shown in FIG. 5, an output of clocked inverter 506 may be coupled to an input of inverter 510 and an output of clocked inverter 508, an output of inverter 510 may be coupled to an input of clocked inverter 508 and an input of transmission gate 512, an output of transmission gate 512 may be coupled to an input of inverter 516, an output of clocked inverter 514, and gates of p-type transistor 522 and n-type transistor 524, and an output of inverter 516 may be coupled to an input of clocked inverter 514, a gate of p-type transistor 518, and a gate of n-type transistor 520.

In some examples, one or more of clock signal 501, inverted clock signal 503, and/or twice-inverted clock signal 505 may be used to clock or enable one or more of the clocked elements of circuit 500. In some examples, inverted clock signal 503 may be coupled to a positive clock or enable input of clocked inverter 506, and twice-inverted clock signal 505 may be coupled to a negative clock or enable input of clocked inverter 506. As such, clocked inverter 506 may be configured to act as an inverter when clock signal 501 is low and a high impedance or an open circuit when clock signal 501 is high. In some examples, inverted clock signal 503 may be coupled to a negative clock or enable input of clocked inverter 508, and twice-inverted clock signal 505 may be coupled to a positive clock or enable input of clocked inverter 508. As such, clocked inverter 508 may be configured to act as an inverter when clock signal 501 is high and a high impedance or an open circuit when clock signal 501 is low. In some examples, inverted clock signal 503 may be coupled to a negative clock or enable input of transmission gate 512, and twice-inverted clock signal 505 may be coupled to a positive clock or enable input of transmission gate 512. As such, transmission gate 512 may be configured to act as a closed circuit when clock signal 501 is high and a high impedance or an open circuit when clock signal 501 is low. In some examples, inverted clock signal 503 may be coupled to a positive clock or enable input of clocked inverter 514, and twice-inverted clock signal 505 may be coupled to a negative clock or enable input of clocked inverter 514. As such, clocked inverter 514 may be configured to act as an inverter when clock signal 501 is low and a high impedance or an open circuit when clock signal 501 is high.

When clock signal 501 is low, clocked inverter 506 may be enabled such that the output of inverter 510 follows or mirrors input signal 507, clocked inverter 508 may be disabled, and transmission gate 512 may be disabled such that the output of inverter 510 is disconnected from the input of inverter 516. Meanwhile, clocked inverter 514 may be enabled creating a feedback loop with inverter 516, and the feedback loop may store a previous value of the output of inverter 510 (e.g., a value before clock signal 501 went low). When clock signal 501 goes high, clocked inverter 506 may be disabled, and clocked inverter 508 may be enabled and may create a feedback loop with inverter 510 such that the last value of input signal 507 before clock signal 501 went high is stored by the feedback loop made up of clocked inverter 508 and inverter 510. When clock signal 501 goes high, transmission gate 512 may also be enabled, and clocked inverter 514 may be disabled such that the output of an inverter made up of a p-type transistor 518 and an n-type transistor 520 follows the output of inverter 510, which corresponds to the value stored by the feedback loop made up of clocked inverter 508 and inverter 510. When clock signal 501 again goes low, transmission gate 512 may be disabled such that the output of inverter 510 is no longer connected to the input of inverter 516. However, clocked inverter 514 may be reenabled such that the feedback loop made up of clocked inverter 514 and inverter 516 is restored to store the previous value of the output of inverter 510 before clock signal 501 went low again.

In this example, when an output signal 511 of transmission gate 512 is low, a corresponding output signal of inverter 516 may be high, p-type transistor 518 may be off, and n-type transistor 520 may be in saturation. Moreover, when output signal 511 of transmission gate 512 is low, p-type transistor 522 may be in saturation, and n-type transistor 524 may be off. The various states of p-type transistor 518, n-type transistor 520, p-type transistor 522, and n-type transistor 524 when output signal 511 is low may cause output signal 509 to be low. On the other hand, when output signal 511 of transmission gate 512 is high, the corresponding output signal of inverter 516 may be low, p-type transistor 518 may be in saturation, and n-type transistor 520 may be off. Moreover, when output signal 511 of transmission gate 512 is high, p-type transistor 522 may be off, and p-type transistor 424 may be in saturation. The various states of p-type transistor 518, n-type transistor 520, p-type transistor 522, and n-type transistor 524 when output signal 511 is high may cause output signal 509 to be high. In some examples, the inclusion of p-type transistor 522, n-type transistor 524, and their associated interconnections may cause hysteresis in circuit 500 and/or one or more of the transistors of circuit 500 to spend less time being driven in its triode, linear, or ohmic mode or region.

Figure 6A:
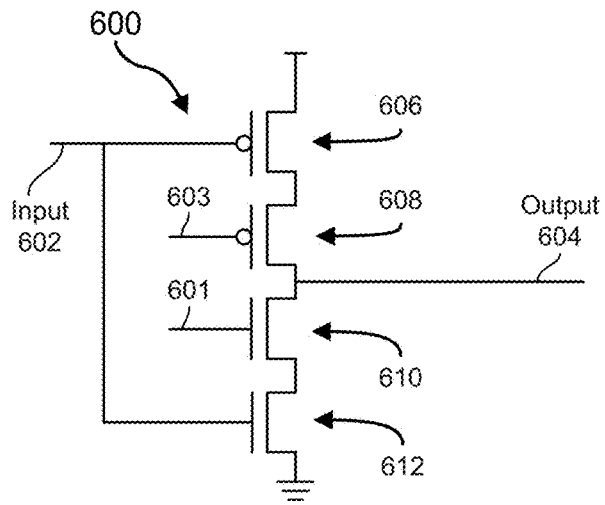
FIGS. 6A, 6B, and 6C are diagrams of exemplary circuit elements according to one or more implementations of this disclosure.

FIG. 6A illustrates an example clocked inverter 600 configured to be controlled by a clock or enable signal 601 and a corresponding inverted (or complement) clock or enable signal 603. As shown, clocked inverter 600 may include an input 602, an output 604, a p-type transistor 606, a p-type transistor 608, a n-type transistor 610, and a n-type transistor 612. In this example, p-type transistor 606, p-type transistor 608, n-type transistor 610, and n-type transistor 612 may be coupled in series with the source of p-type transistor 606 being coupled to a positive supply voltage and the source of n-type transistor 612 being coupled to ground. As shown, input 602 may be coupled to the gate of p-type transistor 606 and n-type transistor 612, clock or enable signal 601 may be coupled to the gate of n-type transistor 610, and inverted clock or enable signal 603 may be coupled to the gate of p-type transistor 608. When clock or enable signal 601 is high and inverted clock or enable signal 603 is low, p-type transistor 608 and n-type transistor 610 may be on and clocked inverter 600 may act as an inverter. On the other hand, when clock or enable signal 601 is low and inverted clock or enable signal 603 is high, p-type transistor 608 and n-type transistor 610 may be off and output 604 may be substantially disconnected from the rest of clocked inverter 600.

Figure 6B:
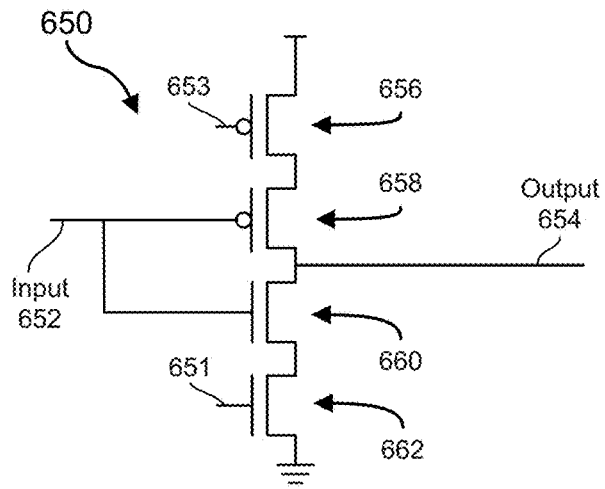

FIG. 6B illustrates an example clocked inverter 650 configured to be controlled by a clock or enable signal 651 and a corresponding inverted clock or enable signal 653. As shown, clocked inverter 650 may include an input 652, an output 654, a p-type transistor 656, a p-type transistor 658, a n-type transistor 660, and a n-type transistor 662. In this example, p-type transistor 656, p-type transistor 658, n-type transistor 660, and n-type transistor 662 may be coupled in series with the source of p-type transistor 656 being coupled to a positive supply voltage and the source of n-type transistor 662 being coupled to ground. As shown, input 652 may be coupled to the gate of p-type transistor 658 and n-type transistor 660, clock or enable signal 651 may be coupled to the gate of n-type transistor 662, and inverted clock or enable signal 653 may be coupled to the gate of p-type transistor 656. When clock or enable signal 651 is high and inverted clock or enable signal 653 is low, p-type transistor 656 and n-type transistor 662 may be on and clocked inverter 650 may act as an inverter. On the other hand, when clock or enable signal 651 is low and inverted clock or enable signal 653 is high, p-type transistor 656 and n-type transistor 662 may be off and output 654 may be substantially disconnected from the positive supply voltage and ground.

Figure 6C:
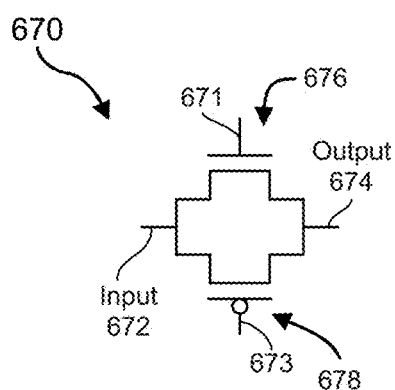

FIG. 6C illustrates an example transmission gate 670 configured to be controlled by a clock or enable signal 671 and a corresponding inverted clock or enable signal 673. As shown, transmission gate 670 may include an input 672, an output 674, a n-type transistor 676, and a p-type transistor 678. In this example, input 672 may be coupled to the source of n-type transistor 676 and the drain of p-type transistor 678, clock or enable signal 671 may be coupled to the gate of n-type transistor 676, and inverted clock or enable signal 673 may be coupled to the gate of p-type transistor 678. When clock or enable signal 671 is high and inverted clock or enable signal 673 is low, n-type transistor 676 and p-type transistor 678 may be on and input 672 and output 674 may be substantially coupled. On the other hand, when clock or enable signal 671 is low and inverted clock or enable signal 673 is high, n-type transistor 676 and p-type transistor 678 may be off and output 674 may be substantially disconnected from input 672.

Figure 7:
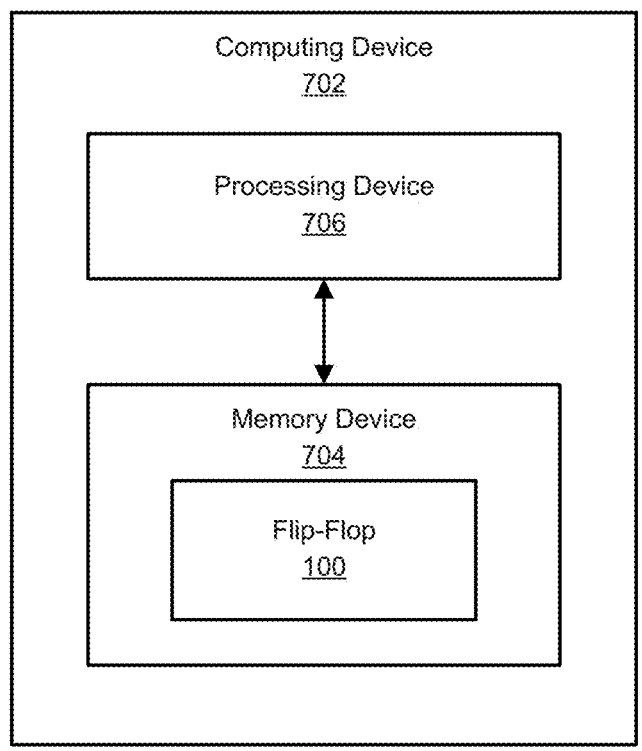
FIG. 7 is a diagram of an exemplary implementation of a flip-flop circuit integrated into or with a memory device and/or a computing device according to one or more embodiments of this disclosure.

FIG. 7 illustrates an example implementation 700 involving a computing device 702. Examples of device 702 include, without limitation, memory devices, processing devices, Central Processing Units (CPUs), Graphics Processing Units (GPUs), microprocessors, microcontrollers, Field-Programmable Gate Arrays (FPGAs), Application-Specific Integrated Circuits (ASICs), Systems-on-a-Chip (SoCs), Static Random-Access Memory (SRAM) devices, Random Access Memory (RAM) devices, Read Only Memory (ROM) devices, flash memory devices, Hard Disk Drives (HDDs), Solid-State Drives (SSDs), optical disk drives, caches, routers, switches, hubs, modems, bridges, repeaters, gateways (such as Broadband Network Gateways (BNGs)), network devices, client devices, laptops, tablets, desktops, servers, cellular phones, Personal Digital Assistants (PDAs), multimedia players, embedded systems, wearable devices, gaming consoles, portions of one or more of the same, variations or combinations of one or more of the same, and/or any other suitable device. As illustrated in example implementation 700 in FIG. 7, computing device 702 includes and/or represents a processing device 706 electrically coupled to a memory device 704. In some examples, memory device 704 maintains and/or stores data in various circuits (e.g., flip-flop 100). Memory device 704 may include and/or contain one or more of the circuits, components, and/or devices illustrated in FIGS. 1-6B. In some examples, processing device 706 can include and/or represent any type or form of hardware-implemented processor capable of executing computer-readable instructions. Examples of processing device 706 include, without limitation, CPUs, GPUs, microprocessors, microcontrollers, FPGAs, ASICS, SoCs, combinations or variations of one or more of the same, and/or any other type of suitable processing device. In some examples, memory device 704 can include and/or represent any type or form of volatile or non-volatile storage device or medium capable of storing data and/or computer-readable instructions. In one example, memory device 704 includes and/or represents an SRAM device.

In some examples, the various circuits, components, and/or devices described in connection with FIGS. 1-7 can include and/or represent one or more additional or functionally equivalent circuits, components, devices, and/or features that are not necessarily illustrated and/or labeled in FIGS. 1-7. For example, such circuits, components, and/or devices can also include and/or represent additional or functionally equivalent analog and/or digital circuitry, onboard logic, transistors, resistors, capacitors, diodes, inductors, switches, registers, flip-flops, connections, traces, buses, semiconductor (e.g., silicon) devices and/or structures, storage devices, circuit boards, housings, combinations or variations of one or more of the same, and/or any other suitable components that facilitate and/or support hysteresis subcircuits for flip-flops. One or more of these additional or functionally equivalent circuits, components, and/or devices can be inserted and/or applied between any of the existing circuits components, and/or devices illustrated in FIGS. 1-7 consistent with the aims and/or objectives provided herein. Accordingly, the communicative and/or electrical couplings described with reference to FIGS. 1-7 can be direct connections with no intermediate components, devices, and/or nodes or indirect connections with one or more intermediate components, devices, and/or nodes.

Figure 8:
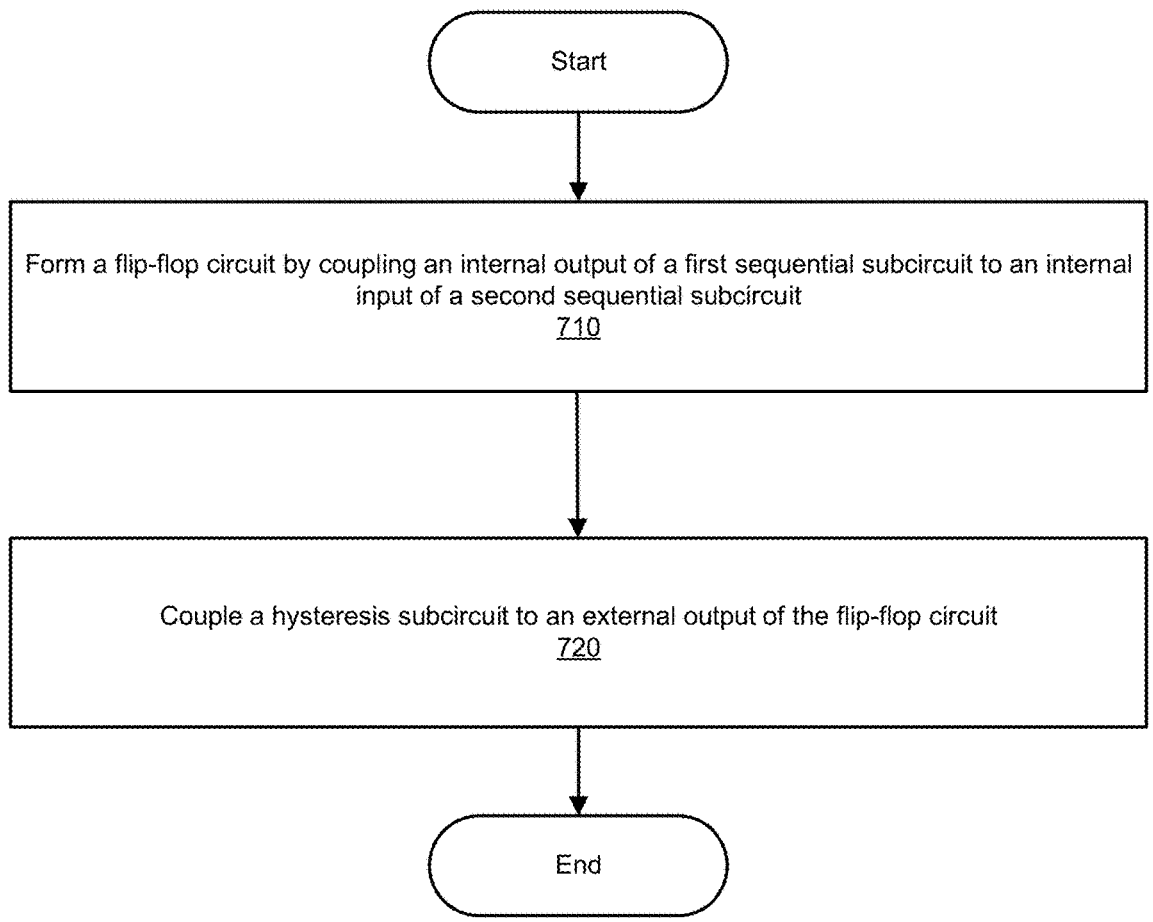
FIG. 8 is a flowchart of an exemplary method for creating flip-flop circuits that experience low or non-existing short-circuit currents according to one or more implementations of this disclosure.

FIG. 8 is a flow diagram of an example method 800 for producing flip-flop circuits having low or non-existent short-circuit currents. In one example, the steps shown in FIG. 8 can incorporate and/or involve various sub-steps and/or variations consistent with the descriptions provided above in connection with FIGS. 1-7. As illustrated in FIG. 8, example method 800 may include and/or involve the step of forming a flip-flop circuit by coupling an internal output of a first sequential subcircuit to an internal input of a second sequential subcircuit (810). Step 810 can be performed in a variety of ways, including any of those described above in connection with FIGS. 1-7. For example, a memory device manufacturer or subcontractor can couple an output of sequential circuit 202 to an input of sequential circuit 204. Example method 800 also includes the step of coupling a hysteresis subcircuit to an external output of the flip-flop circuit (820). Step 820 can be performed in a variety of ways, including any of those described above in connection with FIGS. 1-7. For example, the memory device manufacturer or subcontractor can couple hysteresis circuit 206 to an output of sequential circuit 204.

EXAMPLE EMBODIMENTS

Example 1: A circuit may include (1) an external input, (2) an external output, (3) a flip-flop subcircuit including (A) a first sequential subcircuit for reading data-input signals from the external input, the first sequential subcircuit including a first internal input coupled to the external input and a first internal output, and (B) a second sequential subcircuit for outputting data-output signals to the external output, the second sequential subcircuit including a second internal input coupled to the first internal output of the first sequential subcircuit and a second internal output coupled to the external output, and (4) a hysteresis subcircuit coupled to the external output and configured to reduce a short-circuit current of the circuit.

Example 2: The circuit of Example 1 where the hysteresis subcircuit includes (1) a first transistor having (A) a first gate coupled to the second sequential subcircuit, (B) a first source coupled to the external output, and (C) a first drain coupled to a ground and (2) a second transistor having (D) a second gate coupled to the second sequential subcircuit, (E) a second source coupled to the external output, and (F) a second drain coupled to a positive supply signal.

Example 3: The circuit of any of Examples 1-2 where (1) the first transistor includes a p-type transistor and (2) the second transistor includes an n-type transistor.

Example 4: The circuit of any of Examples 1-3 where (1) the first transistor includes a p-type fin field-effect transistor and (2) the second transistor includes an n-type fin field-effect transistor.

Example 5: The circuit of any of Examples 1-4 where the first gate of the first transistor and the second gate of the second transistor are coupled to the second internal input of the second sequential subcircuit.

Example 6: The circuit of any of Examples 1-5, further including (1) a first inverter coupling the second internal output of the second sequential subcircuit to the external output and (2) a second inverter coupling the second internal output of the second sequential subcircuit to the first gate of the first transistor and the second gate of the second transistor.

Example 7: The circuit of any of Examples 1-6 further including (1) a clocked inverter coupling the external input to the first internal input of the first sequential subcircuit and (2) a transmission gate coupling the first internal output of the first sequential subcircuit to the second internal input of the second sequential subcircuit.

Example 8: The circuit of any of Examples 1-7 where the first sequential subcircuit includes (1) an inverter coupling the first internal input of the first sequential subcircuit to the first internal output of the first sequential subcircuit and (2) a clocked inverter coupling the first internal output of the first sequential subcircuit to the first internal input of the first sequential subcircuit.

Example 9: The circuit of any of Examples 1-8 where the second sequential subcircuit includes (1) an inverter coupling the second internal input of the second sequential subcircuit to the second internal output of the second sequential subcircuit and (2) a clocked inverter coupling the second internal output of the second sequential subcircuit to the second internal input of the second sequential subcircuit.

Example 10: The circuit of any of Examples 1-9 where (1) the flip-flop subcircuit includes a d-type flip-flop, (2) the external input is a data input of the d-type flip-flop, and (3) the external output is a data output of the d-type flip-flop.

Example 11: A device may include (1) a memory and (2) a physical processor coupled to the memory. The memory may include at least one flip-flop circuit including (1) an external input, (2) an external output, (3) a first sequential subcircuit for reading data-input signals from the external input, the first sequential subcircuit including a first internal input coupled to the external input and a first internal output, (4) a second sequential subcircuit for outputting data-output signals to the external output, the second sequential subcircuit including a second internal input coupled to the first internal output of the first sequential subcircuit and a second internal output coupled to the external output, and (5) a hysteresis subcircuit coupled to the external output, the hysteresis subcircuit being configured to reduce a short-circuit current of the flip-flop circuit.

Example 12: The device of Example 11 where the hysteresis subcircuit includes (1) a first transistor having (A) a first gate coupled to the second sequential subcircuit, (B) a first source coupled to the external output, and (C) a first drain coupled to a ground and (2) a second transistor having (D) a second gate coupled to the second sequential subcircuit, (E) a second source coupled to the external output, and (F) a second drain coupled to a positive supply signal.

Example 13: The device of any of Examples 11-12 where (1) the first transistor includes a p-type transistor and (2) the second transistor includes an n-type transistor.

Example 14: The device of any of Examples 11-13 where the first gate of the first transistor and the second gate of the second transistor are coupled to the second internal input of the second sequential subcircuit.

Example 15: The device of any of Examples 11-14, further including (1) a first inverter coupling the second internal output of the second sequential subcircuit to the external output and (2) a second inverter coupling the second internal output of the second sequential subcircuit to the first gate of the first transistor and the second gate of the second transistor.

Example 16: The device of any of Examples 11-15, further including (1) a clocked inverter coupling the external input to the first internal input of the first sequential subcircuit and (2) a transmission gate coupling the first internal output of the first sequential subcircuit to the second internal input of the second sequential subcircuit.

Example 17: The device of any of Examples 11-16 where the first sequential subcircuit includes (2) an inverter coupling the first internal input of the first sequential subcircuit to the first internal output of the first sequential subcircuit and (2) a clocked inverter coupling the first internal output of the first sequential subcircuit to the first internal input of the first sequential subcircuit.

Example 18: The device of any of Examples 11-17 where the second sequential subcircuit includes (1) an inverter coupling the second internal input of the second sequential subcircuit to the second internal output of the second sequential subcircuit and (2) a clocked inverter coupling the second internal output of the second sequential subcircuit to the second internal input of the second sequential subcircuit.

Example 19: The device of any of Examples 11-18 where (1) the flip-flop subcircuit includes a d-type flip-flop, (2) the external input is a data input of the d-type flip-flop, and (3) the external output is a data output of the d-type flip-flop.

Example 20: A method may include (1) coupling an internal output of a first sequential subcircuit to an internal input of a second sequential subcircuit where the first sequential subcircuit is configured to read data-input signals from an external input and the second sequential subcircuit is configured to output data-output signals to an external output and (2) coupling a hysteresis subcircuit to the external output, the hysteresis subcircuit being configured to reduce a short-circuit current of one or more of the first sequential subcircuit and the second sequential subcircuit.

Embodiments of the present disclosure may include or be implemented in-conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (such as, e.g., augmented-reality system 900 in FIG. 9) or that visually immerses a user in an artificial reality (such as, e.g., virtual-reality system 1000 in FIG. 10). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 9:
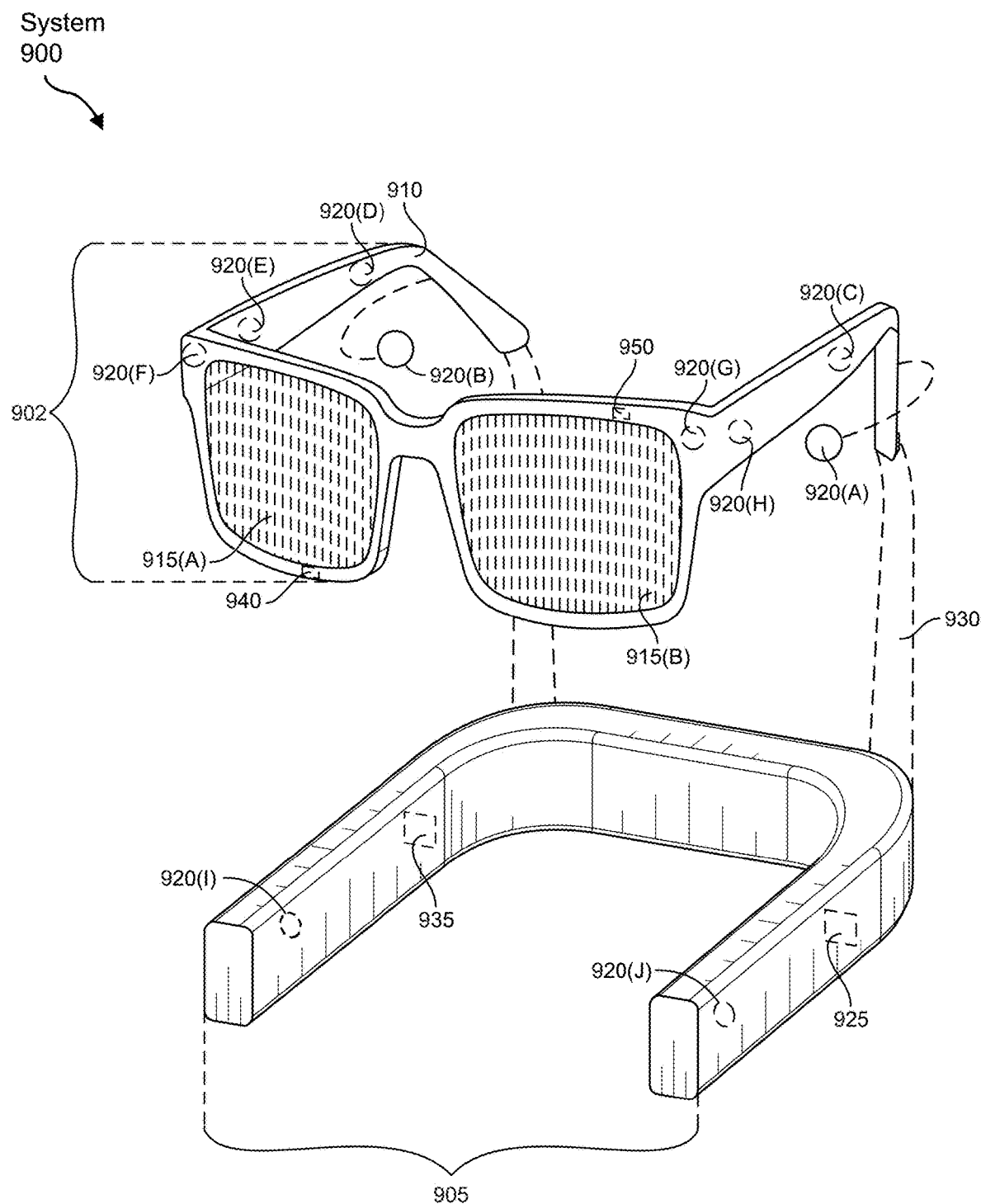
FIG. 9 is an illustration of exemplary augmented-reality glasses that may be used in connection with embodiments of this disclosure.

Turning to FIG. 9, augmented-reality system 900 may include an eyewear device 902 with a frame 910 configured to hold a left display device 915(A) and a right display device 915(B) in front of a user's eyes. Display devices 915(A) and 915(B) may act together or independently to present an image or series of images to a user. While augmented-reality system 900 includes two displays, embodiments of this disclosure may be implemented in augmented-reality systems with a single NED or more than two NEDs.

In some embodiments, augmented reality system 900 may include one or more sensors, such as sensor 940. Sensor 940 may generate measurement signals in response to motion of augmented reality system 900 and may be located on substantially any portion of frame 910. Sensor 940 may represent one or more of a variety of different sensing mechanisms, such as a position sensor, an inertial measurement unit (IMU), a depth camera assembly, a structured light emitter and/or detector, or any combination thereof. In some embodiments, augmented-reality system 900 may or may not include sensor 940 or may include more than one sensor. In embodiments in which sensor 940 includes an IMU, the IMU may generate calibration data based on measurement signals from sensor 940. Examples of sensor 940 may include, without limitation, accelerometers, gyroscopes, magnetometers, other suitable types of sensors that detect motion, sensors used for error correction of the IMU, or some combination thereof.

In some examples, augmented-reality system 900 may also include a microphone array with a plurality of acoustic transducers 920(A)-920(J), referred to collectively as acoustic transducers 920. Acoustic transducers 920 may represent transducers that detect air pressure variations induced by sound waves. Each acoustic transducer 920 may be configured to detect sound and convert the detected sound into an electronic format (e.g., an analog or digital format). The microphone array in FIG. 9 may include, for example, ten acoustic transducers: 920(A) and 920(B), which may be designed to be placed inside a corresponding ear of the user, acoustic transducers 920(C), 920(D), 920(E), 920(F), 920 (G), and 920(H), which may be positioned at various locations on frame 910, and/or acoustic transducers 920(I) and 920(J), which may be positioned on a corresponding neckband 905.

In some embodiments, one or more of acoustic transducers 920(A)-(J) may be used as output transducers (e.g., speakers). For example, acoustic transducers 920(A) and/or 920(B) may be earbuds or any other suitable type of headphone or speaker.

The configuration of acoustic transducers 920 of the microphone array may vary. While augmented-reality system 900 is shown in FIG. 9 as having ten acoustic transducers 920, the number of acoustic transducers 920 may be greater or less than ten. In some embodiments, using higher numbers of acoustic transducers 920 may increase the amount of audio information collected and/or the sensitivity and accuracy of the audio information. In contrast, using a lower number of acoustic transducers 920 may decrease the computing power required by an associated controller 950 to process the collected audio information. In addition, the position of each acoustic transducer 920 of the microphone array may vary. For example, the position of an acoustic transducer 920 may include a defined position on the user, a defined coordinate on frame 910, an orientation associated with each acoustic transducer 920, or some combination thereof.

Acoustic transducers 920(A) and 920(B) may be positioned on different parts of the user's ear, such as behind the pinna, behind the tragus, and/or within the auricle or fossa. Or, there may be additional acoustic transducers 920 on or surrounding the ear in addition to acoustic transducers 920 inside the ear canal. Having an acoustic transducer 920 positioned next to an ear canal of a user may enable the microphone array to collect information on how sounds arrive at the ear canal. By positioning at least two of acoustic transducers 920 on either side of a user's head (e.g., as binaural microphones), augmented-reality device 900 may simulate binaural hearing and capture a 3D stereo sound field around about a user's head. In some embodiments, acoustic transducers 920(A) and 920(B) may be connected to augmented-reality system 900 via a wired connection 930, and in other embodiments acoustic transducers 920(A) and 920(B) may be connected to augmented-reality system 900 via a wireless connection (e.g., a BLUETOOTH connection). In still other embodiments, acoustic transducers 920(A) and 920(B) may not be used at all in conjunction with augmented-reality system 900.

Acoustic transducers 920 on frame 910 may be positioned in a variety of different ways, including along the length of the temples, across the bridge, above or below display devices 915(A) and 915(B), or some combination thereof. Acoustic transducers 920 may also be oriented such that the microphone array is able to detect sounds in a wide range of directions surrounding the user wearing the augmented-reality system 900. In some embodiments, an optimization process may be performed during manufacturing of augmented-reality system 900 to determine relative positioning of each acoustic transducer 920 in the microphone array.

In some examples, augmented-reality system 900 may include or be connected to an external device (e.g., a paired device), such as neckband 905. Neckband 905 generally represents any type or form of paired device. Thus, the following discussion of neckband 905 may also apply to various other paired devices, such as charging cases, smart watches, smart phones, wrist bands, other wearable devices, hand-held controllers, tablet computers, laptop computers, other external compute devices, etc.

As shown, neckband 905 may be coupled to eyewear device 902 via one or more connectors. The connectors may be wired or wireless and may include electrical and/or non-electrical (e.g., structural) components. In some cases, eyewear device 902 and neckband 905 may operate independently without any wired or wireless connection between them. While FIG. 9 illustrates the components of eyewear device 902 and neckband 905 in example locations on eyewear device 902 and neckband 905, the components may be located elsewhere and/or distributed differently on eyewear device 902 and/or neckband 905. In some embodiments, the components of eyewear device 902 and neckband 905 may be located on one or more additional peripheral devices paired with eyewear device 902, neckband 905, or some combination thereof.

Pairing external devices, such as neckband 905, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 900 may be provided by a paired device or shared between a paired device and an eyewear device, thus reducing the weight, heat profile, and form factor of the eyewear device overall while still retaining desired functionality. For example, neckband 905 may allow components that would otherwise be included on an eyewear device to be included in neckband 905 since users may tolerate a heavier weight load on their shoulders than they would tolerate on their heads. Neckband 905 may also have a larger surface area over which to diffuse and disperse heat to the ambient environment. Thus, neckband 905 may allow for greater battery and computation capacity than might otherwise have been possible on a stand-alone eyewear device. Since weight carried in neckband 905 may be less invasive to a user than weight carried in eyewear device 902, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 905 may be communicatively coupled with eyewear device 902 and/or to other devices. These other devices may provide certain functions (e.g., tracking, localizing, depth mapping, processing, storage, etc.) to augmented-reality system 900. In the embodiment of FIG. 9, neckband 905 may include two acoustic transducers (e.g., 920(I) and 920(J)) that are part of the microphone array (or potentially form their own microphone subarray). Neckband 905 may also include a controller 925 and a power source 935.

Acoustic transducers 920(I) and 920(J) of neckband 905 may be configured to detect sound and convert the detected sound into an electronic format (analog or digital). In the embodiment of FIG. 9, acoustic transducers 920(I) and 920(J) may be positioned on neckband 905, thereby increasing the distance between the neckband acoustic transducers 920(I) and 920(J) and other acoustic transducers 920 positioned on eyewear device 902. In some cases, increasing the distance between acoustic transducers 920 of the microphone array may improve the accuracy of beamforming performed via the microphone array. For example, if a sound is detected by acoustic transducers 920(C) and 920(D) and the distance between acoustic transducers 920(C) and 920 (D) is greater than, e.g., the distance between acoustic transducers 920(D) and 920(E), the determined source location of the detected sound may be more accurate than if the sound had been detected by acoustic transducers 920(D) and 920(E).

Controller 925 of neckband 905 may process information generated by the sensors on neckband 905 and/or augmented-reality system 900. For example, controller 925 may process information from the microphone array that describes sounds detected by the microphone array. For each detected sound, controller 925 may perform a direction-of-arrival (DOA) estimation to estimate a direction from which the detected sound arrived at the microphone array. As the microphone array detects sounds, controller 925 may populate an audio data set with the information. In embodiments in which augmented-reality system 900 includes an inertial measurement unit, controller 925 may compute all inertial and spatial calculations from the IMU located on eyewear device 902. A connector may convey information between augmented-reality system 900 and neckband 905 and between augmented-reality system 900 and controller 925. The information may be in the form of optical data, electrical data, wireless data, or any other transmittable data form. Moving the processing of information generated by augmented-reality system 900 to neckband 905 may reduce weight and heat in eyewear device 902, making it more comfortable to the user.

Power source 935 in neckband 905 may provide power to eyewear device 902 and/or to neckband 905. Power source 935 may include, without limitation, lithium ion batteries, lithium-polymer batteries, primary lithium batteries, alkaline batteries, or any other form of power storage. In some cases, power source 935 may be a wired power source. Including power source 935 on neckband 905 instead of on eyewear device 902 may help better distribute the weight and heat generated by power source 935.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1000 in FIG. 10, that mostly or completely covers a user's field of view. Virtual-reality system 1000 may include a front rigid body 1002 and a band 1004 shaped to fit around a user's head. Virtual-reality system 1000 may also include output audio transducers 1006(A) and 1006(B). Furthermore, while not shown in FIG. 10, front rigid body 1002 may include one or more electronic elements, including one or more electronic displays, one or more inertial measurement units (IMUs), one or more tracking emitters or detectors, and/or any other suitable device or system for creating an artificial-reality experience.

Artificial-reality systems may include a variety of types of visual feedback mechanisms. For example, display devices in augmented-reality system 900 and/or virtual-reality system 1000 may include one or more liquid crystal displays (LCDs), light emitting diode (LED) displays, microLED displays, organic LED (OLED) displays, digital light project (DLP) micro-displays, liquid crystal on silicon (LCoS) micro-displays, and/or any other suitable type of display screen. These artificial-reality systems may include a single display screen for both eyes or may provide a display screen for each eye, which may allow for additional flexibility for varifocal adjustments or for correcting a user's refractive error. Some of these artificial-reality systems may also include optical subsystems having one or more lenses (e.g., concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some of the artificial-reality systems described herein may include one or more projection systems. For example, display devices in augmented reality system 900 and/or virtual-reality system 1000 may include microLED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

The artificial-reality systems described herein may also include various types of computer vision components and subsystems. For example, augmented-reality system 900 and/or virtual-reality system 1000 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

The artificial-reality systems described herein may also include one or more input and/or output audio transducers. Output audio transducers may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

In some embodiments, the artificial-reality systems described herein may also include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

As noted, artificial-reality systems 900 and 1000 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 11:
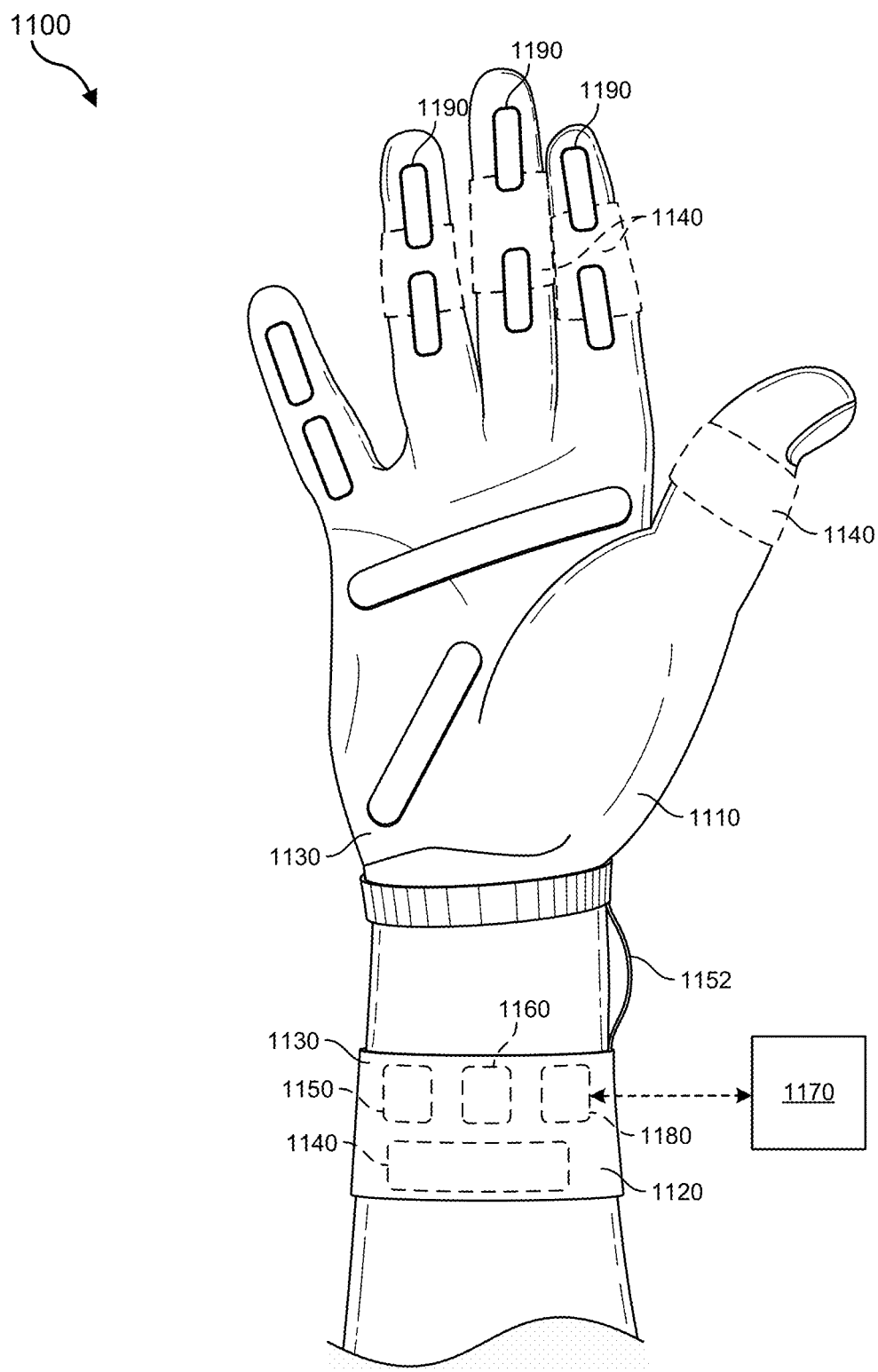
FIG. 11 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 11 illustrates a vibrotactile system 1100 in the form of a wearable glove (haptic device 1110) and wristband (haptic device 1120). Haptic device 1110 and haptic device 1120 are shown as examples of wearable devices that include a flexible, wearable textile material 1130 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1140 may be positioned at least partially within one or more corresponding pockets formed in textile material 1130 of vibrotactile system 1100. Vibrotactile devices 1140 may be positioned in locations to provide a vibrating sensation (e.g., haptic feedback) to a user of vibrotactile system 1100. For example, vibrotactile devices 1140 may be positioned against the user's finger(s), thumb, or wrist, as shown in FIG. 11. Vibrotactile devices 1140 may, in some examples, be sufficiently flexible to conform to or bend with the user's corresponding body part(s).

A power source 1150 (e.g., a battery) for applying a voltage to the vibrotactile devices 1140 for activation thereof may be electrically coupled to vibrotactile devices 1140, such as via conductive wiring 1152. In some examples, each of vibrotactile devices 1140 may be independently electrically coupled to power source 1150 for individual activation. In some embodiments, a processor 1160 may be operatively coupled to power source 1150 and configured (e.g., programmed) to control activation of vibrotactile devices 1140.

Vibrotactile system 1100 may be implemented in a variety of ways. In some examples, vibrotactile system 1100 may be a standalone system with integral subsystems and components for operation independent of other devices and systems. As another example, vibrotactile system 1100 may be configured for interaction with another device or system 1170. For example, vibrotactile system 1100 may, in some examples, include a communications interface 1180 for receiving and/or sending signals to the other device or system 1170. The other device or system 1170 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. Communications interface 1180 may enable communications between vibrotactile system 1100 and the other device or system 1170 via a wireless (e.g., Wi-Fi, BLUETOOTH, cellular, radio, etc.) link or a wired link. If present, communications interface 1180 may be in communication with processor 1160, such as to provide a signal to processor 1160 to activate or deactivate one or more of the vibrotactile devices 1140.

Vibrotactile system 1100 may optionally include other subsystems and components, such as touch-sensitive pads 1190, pressure sensors, motion sensors, position sensors, lighting elements, and/or user interface elements (e.g., an on/off button, a vibration control element, etc.). During use, vibrotactile devices 1140 may be configured to be activated for a variety of different reasons, such as in response to the user's interaction with user interface elements, a signal from the motion or position sensors, a signal from the touch-sensitive pads 1190, a signal from the pressure sensors, a signal from the other device or system 1170, etc.

Although power source 1150, processor 1160, and communications interface 1180 are illustrated in FIG. 11 as being positioned in haptic device 1120, the present disclosure is not so limited. For example, one or more of power source 1150, processor 1160, or communications interface 1180 may be positioned within haptic device 1110 or within another wearable textile.

Figure 12:
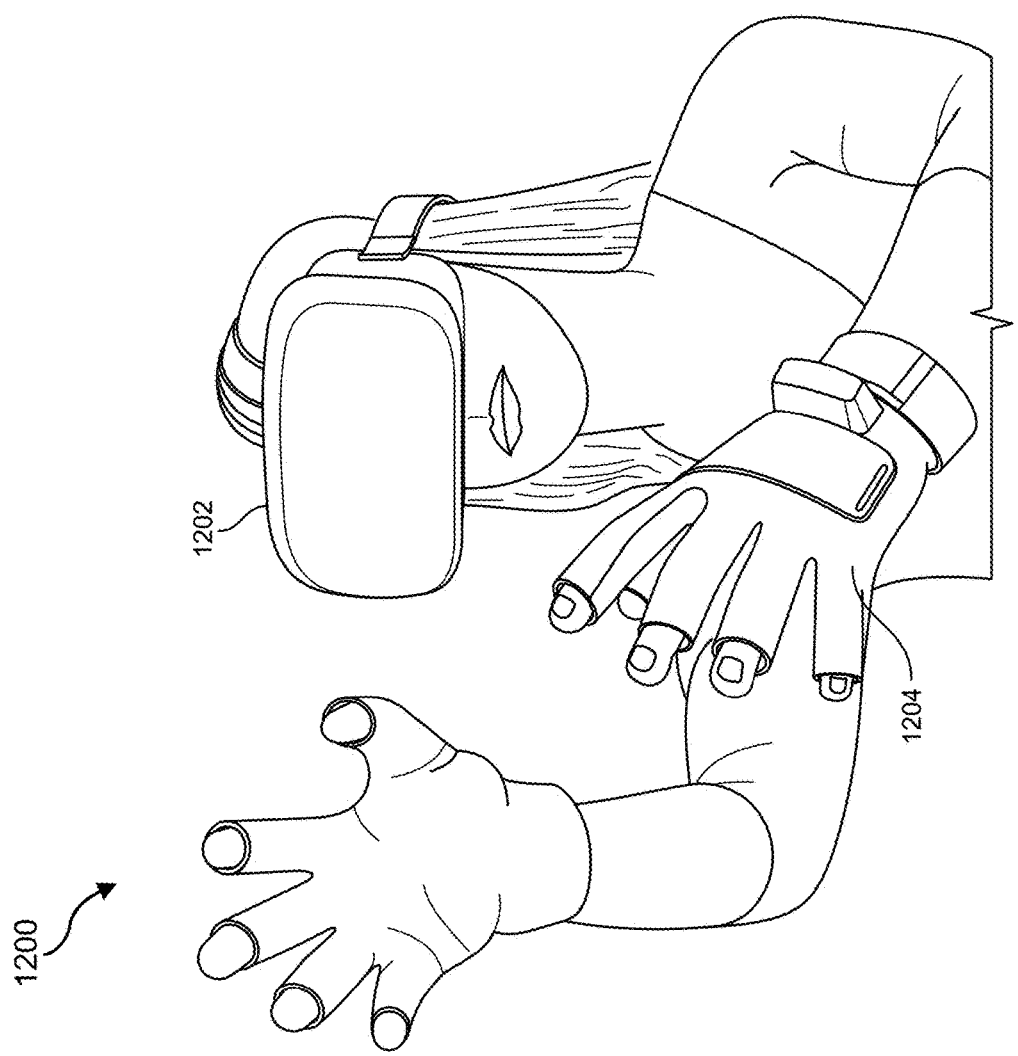
FIG. 12 is an illustration of an exemplary virtual-reality environment according to embodiments of this disclosure.

Haptic wearables, such as those shown in and described in connection with FIG. 11, may be implemented in a variety of types of artificial-reality systems and environments. FIG. 12 shows an example artificial-reality environment 1200 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Figure 10:
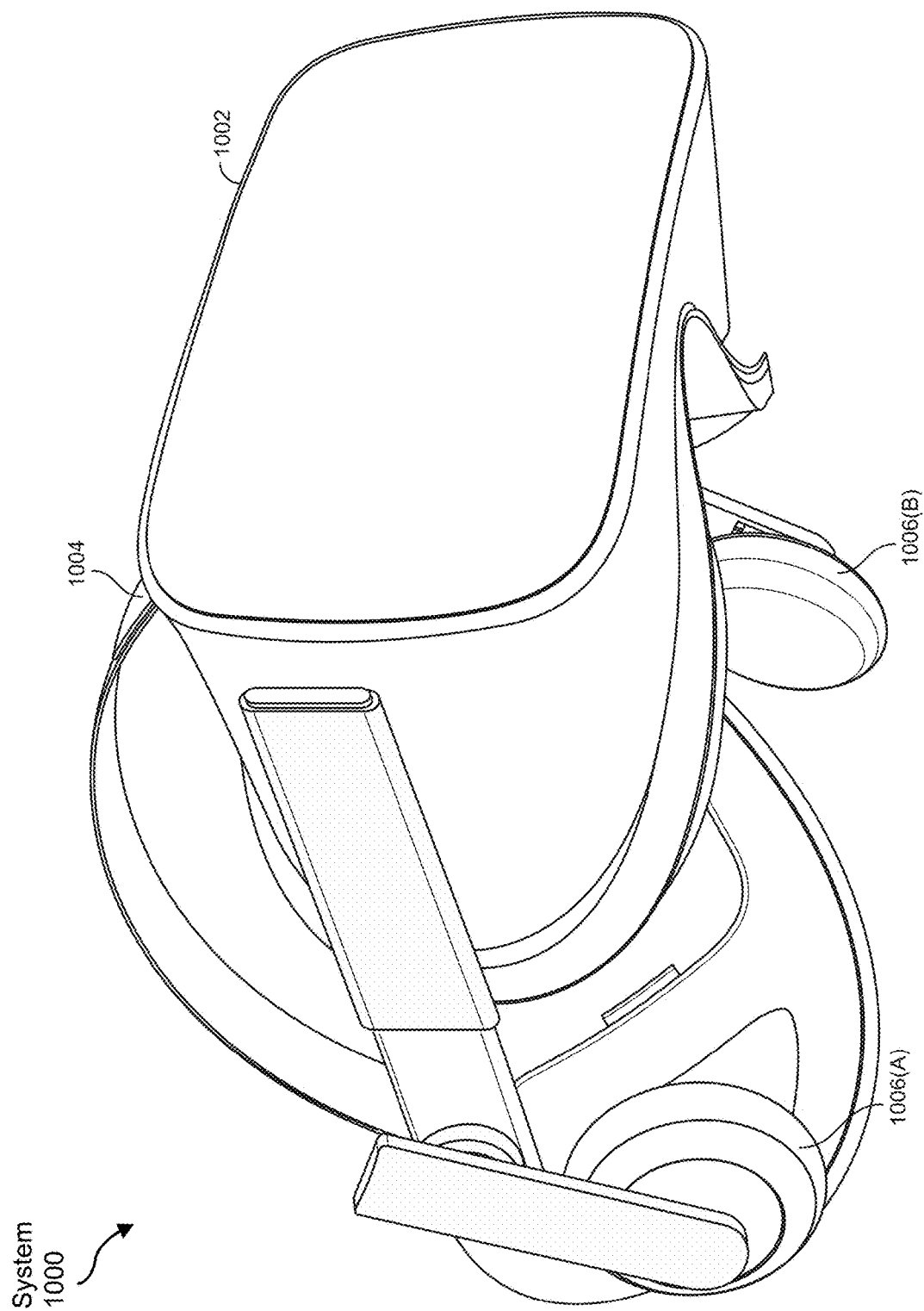
FIG. 10 is an illustration of an exemplary virtual-reality headset that may be used in connection with embodiments of this disclosure.

Head-mounted display 1202 generally represents any type or form of virtual-reality system, such as virtual-reality system 1000 in FIG. 10. Haptic device 1204 generally represents any type or form of wearable device, worn by a user of an artificial-reality system, that provides haptic feedback to the user to give the user the perception that he or she is physically engaging with a virtual object. In some embodiments, haptic device 1204 may provide haptic feedback by applying vibration, motion, and/or force to the user. For example, haptic device 1204 may limit or augment a user's movement. To give a specific example, haptic device 1204 may limit a user's hand from moving forward so that the user has the perception that his or her hand has come in physical contact with a virtual wall. In this specific example, one or more actuators within the haptic device may achieve the physical-movement restriction by pumping fluid into an inflatable bladder of the haptic device. In some examples, a user may also use haptic device 1204 to send action requests to a console. Examples of action requests include, without limitation, requests to start an application and/or end the application and/or requests to perform a particular action within the application.

Figure 13:
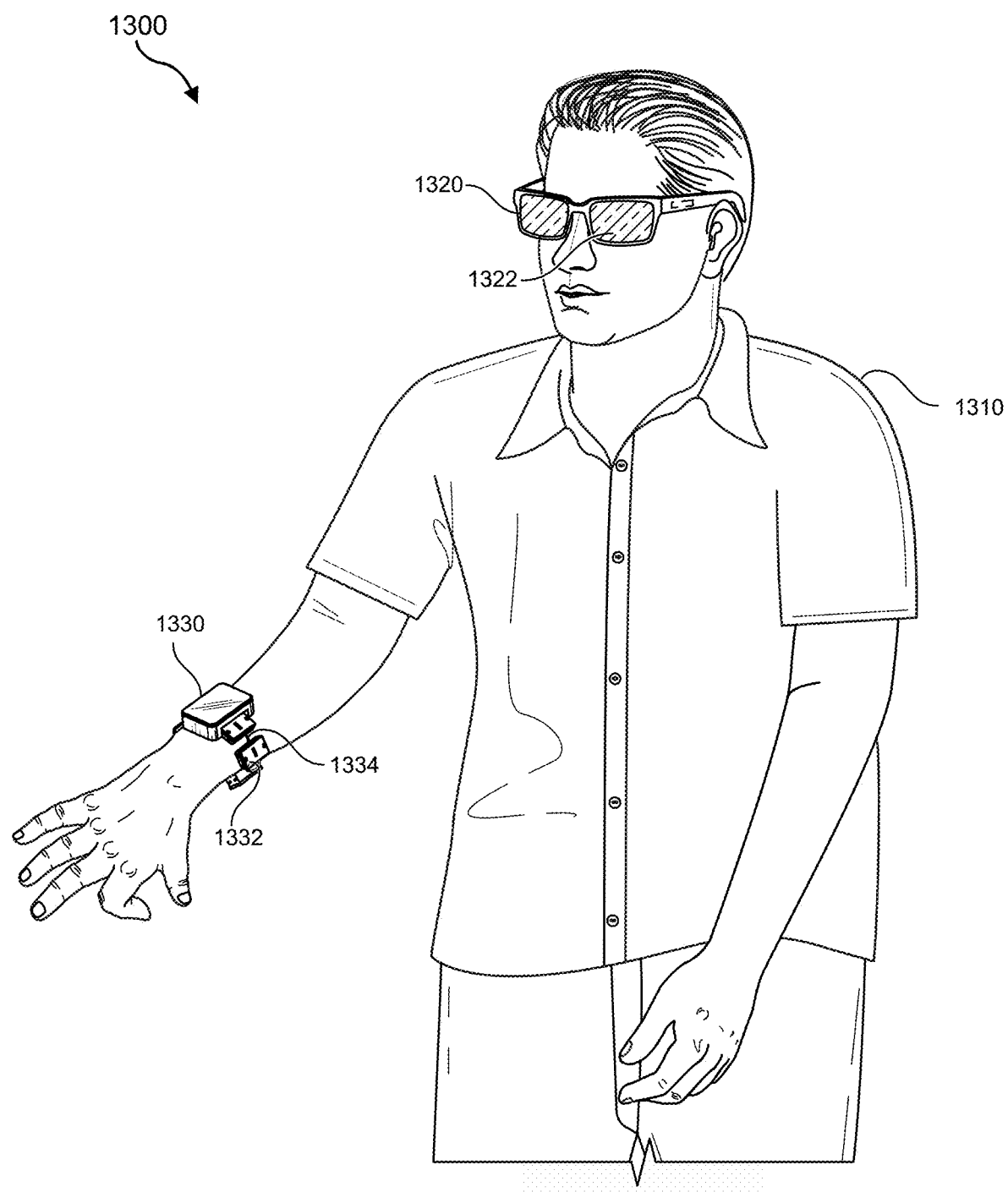
FIG. 13 is an illustration of an exemplary augmented-reality environment according to embodiments of this disclosure.

While haptic interfaces may be used with virtual-reality systems, as shown in FIG. 12, haptic interfaces may also be used with augmented-reality systems, as shown in FIG. 13. FIG. 13 is a perspective view of a user 1310 interacting with an augmented-reality system 1300. In this example, user 1310 may wear a pair of augmented-reality glasses 1320 that may have one or more displays 1322 and that are paired with a haptic device 1330. In this example, haptic device 1330 may be a wristband that includes a plurality of band elements 1332 and a tensioning mechanism 1334 that connects band elements 1332 to one another.

One or more of band elements 1332 may include any type or form of actuator suitable for providing haptic feedback. For example, one or more of band elements 1332 may be configured to provide one or more of various types of cutaneous feedback, including vibration, force, traction, texture, and/or temperature. To provide such feedback, band elements 1332 may include one or more of various types of actuators. In one example, each of band elements 1332 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1110, 1120, 1204, and 1330 may include any suitable number and/or type of haptic transducer, sensor, and/or feedback mechanism. For example, haptic devices 1110, 1120, 1204, and 1330 may include one or more mechanical transducers, piezoelectric transducers, and/or fluidic transducers. Haptic devices 1110, 1120, 1204, and 1330 may also include various combinations of different types and forms of transducers that work together or independently to enhance a user's artificial-reality experience. In one example, each of band elements 1332 of haptic device 1330 may include a vibrotactor (e.g., a vibrotactile actuator) configured to vibrate in unison or independently to provide one or more of various types of haptic sensations to a user.

In some embodiments, the systems described herein may also include an eye-tracking subsystem designed to identify and track various characteristics of a user's eye(s), such as the user's gaze direction. The phrase "eye tracking" may, in some examples, refer to a process by which the position, orientation, and/or motion of an eye is measured, detected, sensed, determined, and/or monitored. The disclosed systems may measure the position, orientation, and/or motion of an eye in a variety of different ways, including through the use of various optical-based eye-tracking techniques, ultrasound-based eye-tracking techniques, etc. An eye-tracking subsystem may be configured in a number of different ways and may include a variety of different eye-tracking hardware components or other computer-vision components. For example, an eye-tracking subsystem may include a variety of different optical sensors, such as two-dimensional (2D) or 3D cameras, time-of-flight depth sensors, single-beam or sweeping laser rangefinders, 3D LiDAR sensors, and/or any other suitable type or form of optical sensor. In this example, a processing subsystem may process data from one or more of these sensors to measure, detect, determine, and/or otherwise monitor the position, orientation, and/or motion of the user's eye(s).

Figure 14:
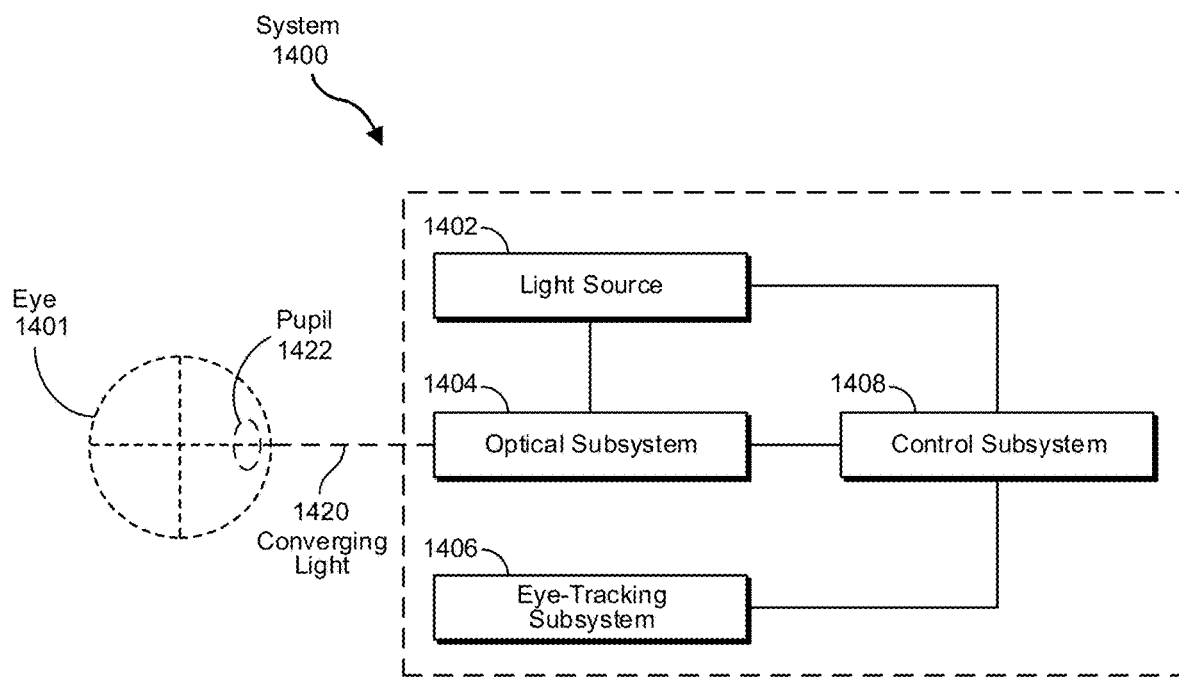
FIG. 14 an illustration of an exemplary system that incorporates an eye-tracking subsystem capable of tracking a user's eye(s).

FIG. 14 is an illustration of an exemplary system 1400 that incorporates an eye-tracking subsystem capable of tracking a user's eye(s). As depicted in FIG. 14, system 1400 may include a light source 1402, an optical subsystem 1404, an eye-tracking subsystem 1406, and/or a control subsystem 1408. In some examples, light source 1402 may generate light for an image (e.g., to be presented to an eye 1401 of the viewer). Light source 1402 may represent any of a variety of suitable devices. For example, light source 1402 can include a two-dimensional projector (e.g., a LCoS display), a scanning source (e.g., a scanning laser), or other device (e.g., an LCD, an LED display, an OLED display, an active-matrix OLED display (AMOLED), a transparent OLED display (TOLED), a waveguide, or some other display capable of generating light for presenting an image to the viewer). In some examples, the image may represent a virtual image, which may refer to an optical image formed from the apparent divergence of light rays from a point in space, as opposed to an image formed from the light ray's actual divergence.

In some embodiments, optical subsystem 1404 may receive the light generated by light source 1402 and generate, based on the received light, converging light 1420 that includes the image. In some examples, optical subsystem 1404 may include any number of lenses (e.g., Fresnel lenses, convex lenses, concave lenses), apertures, filters, mirrors, prisms, and/or other optical components, possibly in combination with actuators and/or other devices. In particular, the actuators and/or other devices may translate and/or rotate one or more of the optical components to alter one or more aspects of converging light 1420. Further, various mechanical couplings may serve to maintain the relative spacing and/or the orientation of the optical components in any suitable combination.

In one embodiment, eye-tracking subsystem 1406 may generate tracking information indicating a gaze angle of an eye 1401 of the viewer. In this embodiment, control subsystem 1408 may control aspects of optical subsystem 1404 (e.g., the angle of incidence of converging light 1420) based at least in part on this tracking information. Additionally, in some examples, control subsystem 1408 may store and utilize historical tracking information (e.g., a history of the tracking information over a given duration, such as the previous second or fraction thereof) to anticipate the gaze angle of eye 1401 (e.g., an angle between the visual axis and the anatomical axis of eye 1401). In some embodiments, eye-tracking subsystem 1406 may detect radiation emanating from some portion of eye 1401 (e.g., the cornea, the iris, the pupil, or the like) to determine the current gaze angle of eye 1401. In other examples, eye-tracking subsystem 1406 may employ a wavefront sensor to track the current location of the pupil.

Any number of techniques can be used to track eye 1401. Some techniques may involve illuminating eye 1401 with infrared light and measuring reflections with at least one optical sensor that is tuned to be sensitive to the infrared light. Information about how the infrared light is reflected from eye 1401 may be analyzed to determine the position(s), orientation(s), and/or motion(s) of one or more eye feature(s), such as the cornea, pupil, iris, and/or retinal blood vessels.

In some examples, the radiation captured by a sensor of eye-tracking subsystem 1406 may be digitized (i.e., converted to an electronic signal). Further, the sensor may transmit a digital representation of this electronic signal to one or more processors (for example, processors associated with a device including eye-tracking subsystem 1406). Eye-tracking subsystem 1406 may include any of a variety of sensors in a variety of different configurations. For example, eye-tracking subsystem 1406 may include an infrared detector that reacts to infrared radiation. The infrared detector may be a thermal detector, a photonic detector, and/or any other suitable type of detector. Thermal detectors may include detectors that react to thermal effects of the incident infrared radiation.

In some examples, one or more processors may process the digital representation generated by the sensor(s) of eye-tracking subsystem 1406 to track the movement of eye 1401. In another example, these processors may track the movements of eye 1401 by executing algorithms represented by computer-executable instructions stored on non-transitory memory. In some examples, on-chip logic (e.g., an application-specific integrated circuit or ASIC) may be used to perform at least portions of such algorithms. As noted, eye-tracking subsystem 1406 may be programmed to use an output of the sensor(s) to track movement of eye 1401. In some embodiments, eye-tracking subsystem 1406 may analyze the digital representation generated by the sensors to extract eye rotation information from changes in reflections. In one embodiment, eye-tracking subsystem 1406 may use corneal reflections or glints (also known as Purkinje images) and/or the center of the eye's pupil 1422 as features to track over time.

In some embodiments, eye-tracking subsystem 1406 may use the center of the eye's pupil 1422 and infrared or near-infrared, non-collimated light to create corneal reflections. In these embodiments, eye-tracking subsystem 1406 may use the vector between the center of the eye's pupil 1422 and the corneal reflections to compute the gaze direction of eye 1401. In some embodiments, the disclosed systems may perform a calibration procedure for an individual (using, e.g., supervised or unsupervised techniques) before tracking the user's eyes. For example, the calibration procedure may include directing users to look at one or more points displayed on a display while the eye-tracking system records the values that correspond to each gaze position associated with each point.

In some embodiments, eye-tracking subsystem 1406 may use two types of infrared and/or near-infrared (also known as active light) eye-tracking techniques: bright-pupil and dark-pupil eye tracking, which may be differentiated based on the location of an illumination source with respect to the optical elements used. If the illumination is coaxial with the optical path, then eye 1401 may act as a retroreflector as the light reflects off the retina, thereby creating a bright pupil effect similar to a red-eye effect in photography. If the illumination source is offset from the optical path, then the eye's pupil 1422 may appear dark because the retroreflection from the retina is directed away from the sensor. In some embodiments, bright-pupil tracking may create greater iris/pupil contrast, allowing more robust eye tracking with iris pigmentation, and may feature reduced interference (e.g., interference caused by eyelashes and other obscuring features). Bright-pupil tracking may also allow tracking in lighting conditions ranging from total darkness to a very bright environment.

In some embodiments, control subsystem 1408 may control light source 1402 and/or optical subsystem 1404 to reduce optical aberrations (e.g., chromatic aberrations and/or monochromatic aberrations) of the image that may be caused by or influenced by eye 1401. In some examples, as mentioned above, control subsystem 1408 may use the tracking information from eye-tracking subsystem 1406 to perform such control. For example, in controlling light source 1402, control subsystem 1408 may alter the light generated by light source 1402 (e.g., by way of image rendering) to modify (e.g., pre-distort) the image so that the aberration of the image caused by eye 1401 is reduced.

The disclosed systems may track both the position and relative size of the pupil (since, e.g., the pupil dilates and/or contracts). In some examples, the eye-tracking devices and components (e.g., sensors and/or sources) used for detecting and/or tracking the pupil may be different (or calibrated differently) for different types of eyes. For example, the frequency range of the sensors may be different (or separately calibrated) for eyes of different colors and/or different pupil types, sizes, and/or the like. As such, the various eye-tracking components (e.g., infrared sources and/or sensors) described herein may need to be calibrated for each individual user and/or eye.

The disclosed systems may track both eyes with and without ophthalmic correction, such as that provided by contact lenses worn by the user. In some embodiments, ophthalmic correction elements (e.g., adjustable lenses) may be directly incorporated into the artificial reality systems described herein. In some examples, the color of the user's eye may necessitate modification of a corresponding eye-tracking algorithm. For example, eye-tracking algorithms may need to be modified based at least in part on the differing color contrast between a brown eye and, for example, a blue eye.

Figure 15:
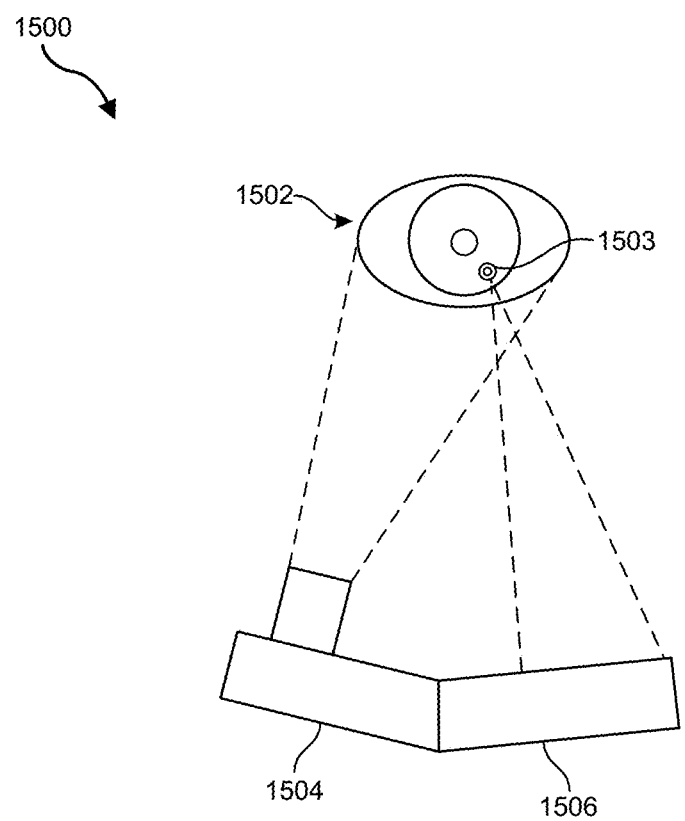
FIG. 15 is a more detailed illustration of various aspects of the eye-tracking subsystem illustrated in FIG. 14.
Figure 15:
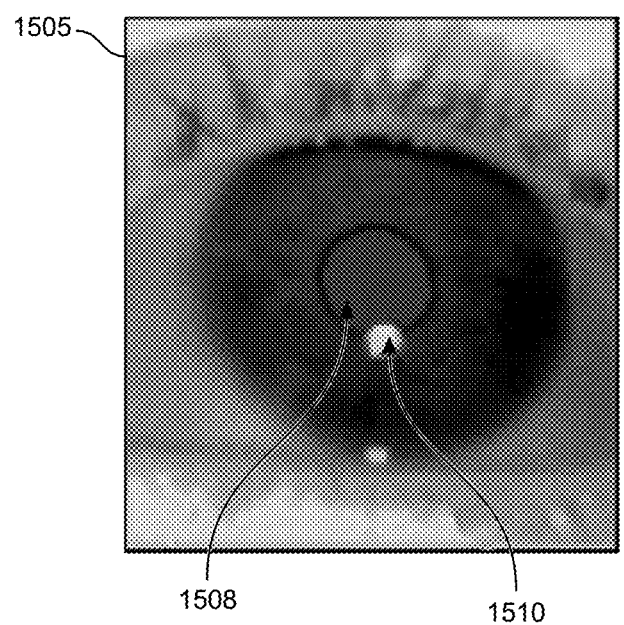

FIG. 15 is a more detailed illustration of various aspects of the eye-tracking subsystem illustrated in FIG. 14. As shown in this figure, an eye-tracking subsystem 1500 may include at least one source 1504 and at least one sensor 1506. Source 1504 generally represents any type or form of element capable of emitting radiation. In one example, source 1504 may generate visible, infrared, and/or near-infrared radiation. In some examples, source 1504 may radiate non-collimated infrared and/or near-infrared portions of the electromagnetic spectrum towards an eye 1502 of a user. Source 1504 may utilize a variety of sampling rates and speeds. For example, the disclosed systems may use sources with higher sampling rates in order to capture fixational eye movements of a user's eye 1502 and/or to correctly measure saccade dynamics of the user's eye 1502. As noted above, any type or form of eye-tracking technique may be used to track the user's eye 1502, including optical-based eye-tracking techniques, ultrasound-based eye-tracking techniques, etc.

Sensor 1506 generally represents any type or form of element capable of detecting radiation, such as radiation reflected off the user's eye 1502. Examples of sensor 1506 include, without limitation, a charge coupled device (CCD), a photodiode array, a complementary metal-oxide-semiconductor (CMOS) based sensor device, and/or the like. In one example, sensor 1506 may represent a sensor having predetermined parameters, including, but not limited to, a dynamic resolution range, linearity, and/or other characteristic selected and/or designed specifically for eye tracking.

As detailed above, eye-tracking subsystem 1500 may generate one or more glints. As detailed above, a glint 1503 may represent reflections of radiation (e.g., infrared radiation from an infrared source, such as source 1504) from the structure of the user's eye. In various embodiments, glint 1503 and/or the user's pupil may be tracked using an eye-tracking algorithm executed by a processor (either within or external to an artificial reality device). For example, an artificial reality device may include a processor and/or a memory device in order to perform eye tracking locally and/or a transceiver to send and receive the data necessary to perform eye tracking on an external device (e.g., a mobile phone, cloud server, or other computing device).

FIG. 15 shows an example image 1505 captured by an eye-tracking subsystem, such as eye-tracking subsystem 1500. In this example, image 1505 may include both the user's pupil 1508 and a glint 1510 near the same. In some examples, pupil 1508 and/or glint 1510 may be identified using an artificial-intelligence-based algorithm, such as a computer-vision-based algorithm. In one embodiment, image 1505 may represent a single frame in a series of frames that may be analyzed continuously in order to track the eye 1502 of the user. Further, pupil 1508 and/or glint 1510 may be tracked over a period of time to determine a user's gaze.

In one example, eye-tracking subsystem 1500 may be configured to identify and measure the inter-pupillary distance (IPD) of a user. In some embodiments, eye-tracking subsystem 1500 may measure and/or calculate the IPD of the user while the user is wearing the artificial reality system. In these embodiments, eye-tracking subsystem 1500 may detect the positions of a user's eyes and may use this information to calculate the user's IPD.

As noted, the eye-tracking systems or subsystems disclosed herein may track a user's eye position and/or eye movement in a variety of ways. In one example, one or more light sources and/or optical sensors may capture an image of the user's eyes. The eye-tracking subsystem may then use the captured information to determine the user's inter-pupillary distance, interocular distance, and/or a 3D position of each eye (e.g., for distortion adjustment purposes), including a magnitude of torsion and rotation (i.e., roll, pitch, and yaw) and/or gaze directions for each eye. In one example, infrared light may be emitted by the eye-tracking subsystem and reflected from each eye. The reflected light may be received or detected by an optical sensor and analyzed to extract eye rotation data from changes in the infrared light reflected by each eye.

The eye-tracking subsystem may use any of a variety of different methods to track the eyes of a user. For example, a light source (e.g., infrared light-emitting diodes) may emit a dot pattern onto each eye of the user. The eye-tracking subsystem may then detect (e.g., via an optical sensor coupled to the artificial reality system) and analyze a reflection of the dot pattern from each eye of the user to identify a location of each pupil of the user. Accordingly, the eye-tracking subsystem may track up to six degrees of freedom of each eye (i.e., 3D position, roll, pitch, and yaw) and at least a subset of the tracked quantities may be combined from two eyes of a user to estimate a gaze point (i.e., a 3D location or position in a virtual scene where the user is looking) and/or an IPD.

In some cases, the distance between a user's pupil and a display may change as the user's eye moves to look in different directions. The varying distance between a pupil and a display as viewing direction changes may be referred to as "pupil swim" and may contribute to distortion perceived by the user as a result of light focusing in different locations as the distance between the pupil and the display changes. Accordingly, measuring distortion at different eye positions and pupil distances relative to displays and generating distortion corrections for different positions and distances may allow mitigation of distortion caused by pupil swim by tracking the 3D position of a user's eyes and applying a distortion correction corresponding to the 3D position of each of the user's eyes at a given point in time. Thus, knowing the 3D position of each of a user's eyes may allow for the mitigation of distortion caused by changes in the distance between the pupil of the eye and the display by applying a distortion correction for each 3D eye position. Furthermore, as noted above, knowing the position of each of the user's eyes may also enable the eye-tracking subsystem to make automated adjustments for a user's IPD.

In some embodiments, a display subsystem may include a variety of additional subsystems that may work in conjunction with the eye-tracking subsystems described herein. For example, a display subsystem may include a varifocal subsystem, a scene-rendering module, and/or a vergence-processing module. The varifocal subsystem may cause left and right display elements to vary the focal distance of the display device. In one embodiment, the varifocal subsystem may physically change the distance between a display and the optics through which it is viewed by moving the display, the optics, or both. Additionally, moving or translating two lenses relative to each other may also be used to change the focal distance of the display. Thus, the varifocal subsystem may include actuators or motors that move displays and/or optics to change the distance between them. This varifocal subsystem may be separate from or integrated into the display subsystem. The varifocal subsystem may also be integrated into or separate from its actuation subsystem and/or the eye-tracking subsystems described herein.

In one example, the display subsystem may include a vergence-processing module configured to determine a vergence depth of a user's gaze based on a gaze point and/or an estimated intersection of the gaze lines determined by the eye-tracking subsystem. Vergence may refer to the simultaneous movement or rotation of both eyes in opposite directions to maintain single binocular vision, which may be naturally and automatically performed by the human eye. Thus, a location where a user's eyes are verged is where the user is looking and is also typically the location where the user's eyes are focused. For example, the vergence-processing module may triangulate gaze lines to estimate a distance or depth from the user associated with intersection of the gaze lines. The depth associated with intersection of the gaze lines may then be used as an approximation for the accommodation distance, which may identify a distance from the user where the user's eyes are directed. Thus, the vergence distance may allow for the determination of a location where the user's eyes should be focused and a depth from the user's eyes at which the eyes are focused, thereby providing information (such as an object or plane of focus) for rendering adjustments to the virtual scene.

The vergence-processing module may coordinate with the eye-tracking subsystems described herein to make adjustments to the display subsystem to account for a user's vergence depth. When the user is focused on something at a distance, the user's pupils may be slightly farther apart than when the user is focused on something close. The eye-tracking subsystem may obtain information about the user's vergence or focus depth and may adjust the display subsystem to be closer together when the user's eyes focus or verge on something close and to be farther apart when the user's eyes focus or verge on something at a distance.

The eye-tracking information generated by the above-described eye-tracking subsystems may also be used, for example, to modify various aspect of how different computer-generated images are presented. For example, a display subsystem may be configured to modify, based on information generated by an eye-tracking subsystem, at least one aspect of how the computer-generated images are presented. For instance, the computer-generated images may be modified based on the user's eye movement, such that if a user is looking up, the computer-generated images may be moved upward on the screen. Similarly, if the user is looking to the side or down, the computer-generated images may be moved to the side or downward on the screen. If the user's eyes are closed, the computer-generated images may be paused or removed from the display and resumed once the user's eyes are back open.

The above-described eye-tracking subsystems can be incorporated into one or more of the various artificial reality systems described herein in a variety of ways. For example, one or more of the various components of system 1400 and/or eye-tracking subsystem 1500 may be incorporated into augmented-reality system 900 in FIG. 9 and/or virtual-reality system 1000 in FIG. 10 to enable these systems to perform various eye-tracking tasks (including one or more of the eye-tracking operations described herein).

Figure 16A:
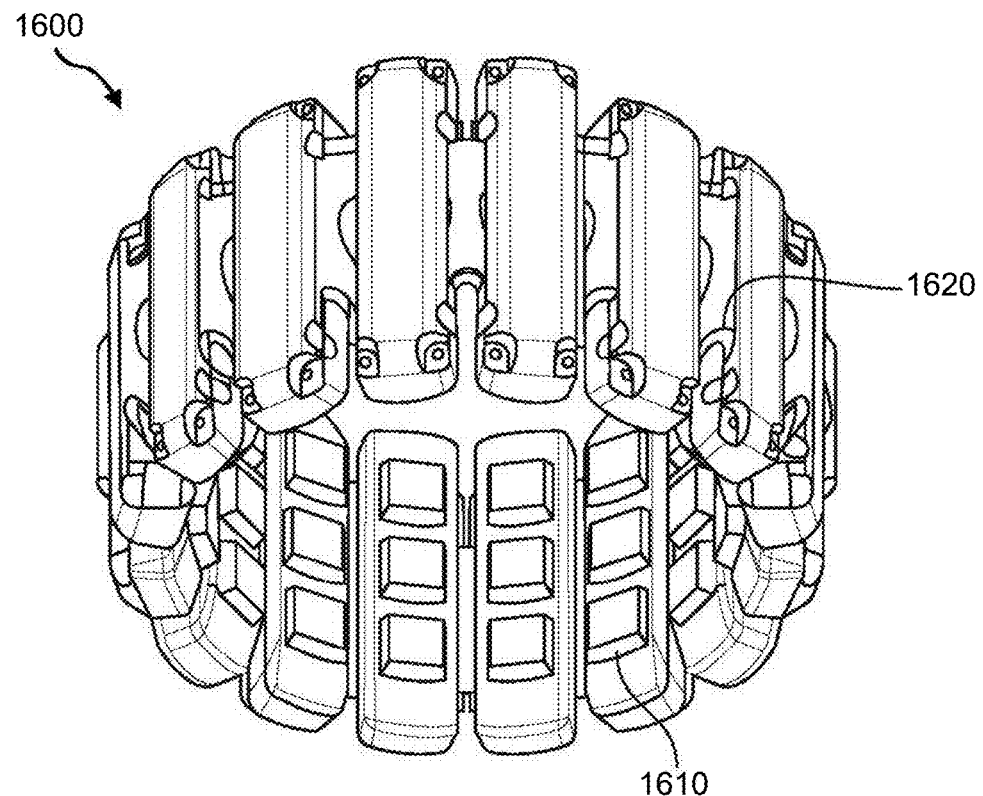
FIGS. 16A and 16B are illustrations of an exemplary human-machine interface configured to be worn around a user's lower arm or wrist.
Figure 16B:
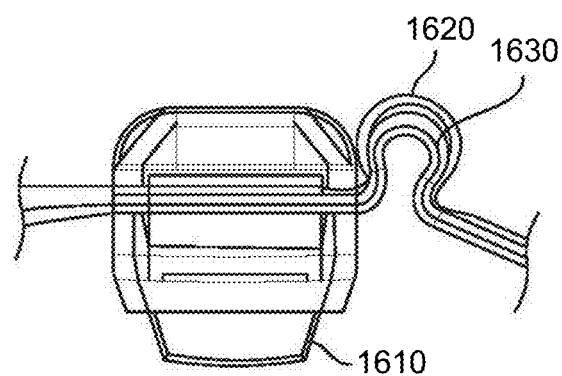

FIG. 16A illustrates an exemplary human-machine interface (also referred to herein as an EMG control interface) configured to be worn around a user's lower arm or wrist as a wearable system 1600. In this example, wearable system 1600 may include sixteen neuromuscular sensors 1610 (e.g., EMG sensors) arranged circumferentially around an elastic band 1620 with an interior surface 1630 configured to contact a user's skin. However, any suitable number of neuromuscular sensors may be used. The number and arrangement of neuromuscular sensors may depend on the particular application for which the wearable device is used. For example, a wearable armband or wristband can be used to generate control information for controlling an augmented reality system, a robot, controlling a vehicle, scrolling through text, controlling a virtual avatar, or any other suitable control task. As shown, the sensors may be coupled together using flexible electronics incorporated into the wireless device. FIG. 16B illustrates a cross-sectional view through one of the sensors of the wearable device shown in FIG. 16A. In some embodiments, the output of one or more of the sensing components can be optionally processed using hardware signal processing circuitry (e.g., to perform amplification, filtering, and/or rectification). In other embodiments, at least some signal processing of the output of the sensing components can be performed in software. Thus, signal processing of signals sampled by the sensors can be performed in hardware, software, or by any suitable combination of hardware and software, as aspects of the technology described herein are not limited in this respect. A non-limiting example of a signal processing chain used to process recorded data from sensors 1610 is discussed in more detail below with reference to FIGS. 17A and 17B.

FIGS. 17A and 17B illustrate an exemplary schematic diagram with internal components of a wearable system with EMG sensors. As shown, the wearable system may include a wearable portion 1710 (FIG. 17A) and a dongle portion 1720 (FIG. 17B) in communication with the wearable portion 1710 (e.g., via BLUETOOTH or another suitable wireless communication technology). As shown in FIG. 17A, the wearable portion 1710 may include skin contact electrodes 1711, examples of which are described in connection with FIGS. 16A and 16B. The output of the skin contact electrodes 1711 may be provided to analog front end 1730, which may be configured to perform analog processing (e.g., amplification, noise reduction, filtering, etc.) on the recorded signals. The processed analog signals may then be provided to analog-to-digital converter 1732, which may convert the analog signals to digital signals that can be processed by one or more computer processors. An example of a computer processor that may be used in accordance with some embodiments is microcontroller (MCU) 1734, illustrated in FIG. 17A. As shown, MCU 1734 may also include inputs from other sensors (e.g., IMU sensor 1740), and power and battery module 1742. The output of the processing performed by MCU 1734 may be provided to antenna 1750 for transmission to dongle portion 1720 shown in FIG. 17B.

Dongle portion 1720 may include antenna 1752, which may be configured to communicate with antenna 1750 included as part of wearable portion 1710. Communication between antennas 1750 and 1752 may occur using any suitable wireless technology and protocol, non-limiting examples of which include radiofrequency signaling and BLUETOOTH. As shown, the signals received by antenna 1752 of dongle portion 1720 may be provided to a host computer for further processing, display, and/or for effecting control of a particular physical or virtual object or objects.

Although the examples provided with reference to FIGS. 16A-16B and FIGS. 17A-17B are discussed in the context of interfaces with EMG sensors, the techniques described herein for reducing electromagnetic interference can also be implemented in wearable interfaces with other types of sensors including, but not limited to, mechanomyography (MMG) sensors, sonomyography (SMG) sensors, and electrical impedance tomography (EIT) sensors. The techniques described herein for reducing electromagnetic interference can also be implemented in wearable interfaces that communicate with computer hosts through wires and cables (e.g., USB cables, optical fiber cables, etc.).

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In addition, one or more of the modules described herein may transform data, physical devices, and/or representations of physical devices from one form to another. For example, one or more of the modules recited herein may transform a processor, volatile memory, non-volatile memory, and/or any other portion of a physical computing device from one form to another by executing on the computing device, storing data on the computing device, and/or otherwise interacting with the computing device.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A circuit comprising:
   an external input;
   an external output;
   a flip-flop subcircuit comprising:
     a first sequential subcircuit for reading data-input signals from the external input, the first sequential subcircuit comprising:
       a first internal input coupled to the external input; and
       a first internal output; and
     a second sequential subcircuit for outputting data-output signals to the external output, the second sequential subcircuit comprising:
       a second internal input coupled to the first internal output of the first sequential subcircuit; and
       a second internal output coupled to the external output; and
   a hysteresis subcircuit coupled to the external output, the hysteresis subcircuit being configured to reduce a short-circuit current of the circuit.

2. The circuit of claim 1, wherein the hysteresis subcircuit comprises:
   a first transistor comprising:
     a first gate coupled to the second sequential subcircuit;
     a first source coupled to the external output; and
     a first drain coupled to a ground; and
   a second transistor comprising;
     a second gate coupled to the second sequential subcircuit;
     a second source coupled to the external output; and
     a second drain coupled to a positive supply signal.

3. The circuit of claim 2, wherein:
   the first transistor comprises a p-type transistor; and
   the second transistor comprises an n-type transistor.

4. The circuit of claim 2, wherein:
   the first transistor comprises a p-type fin field-effect transistor; and
   the second transistor comprises an n-type fin field-effect transistor.

5. The circuit of claim 2, wherein the first gate of the first transistor and the second gate of the second transistor are coupled to the second internal input of the second sequential subcircuit.

6. The circuit of claim 2, further comprising:
   a first inverter coupling the second internal output of the second sequential subcircuit to the external output; and
   a second inverter coupling the second internal output of the second sequential subcircuit to the first gate of the first transistor and the second gate of the second transistor.

7. The circuit of claim 2, further comprising:
   a clocked inverter coupling the external input to the first internal input of the first sequential subcircuit; and
   a transmission gate coupling the first internal output of the first sequential subcircuit to the second internal input of the second sequential subcircuit.

8. The circuit of claim 2, wherein the first sequential subcircuit comprises:
   an inverter coupling the first internal input of the first sequential subcircuit to the first internal output of the first sequential subcircuit; and
   a clocked inverter coupling the first internal output of the first sequential subcircuit to the first internal input of the first sequential subcircuit.

9. The circuit of claim 2, wherein the second sequential subcircuit comprises:
   an inverter coupling the second internal input of the second sequential subcircuit to the second internal output of the second sequential subcircuit; and
   a clocked inverter coupling the second internal output of the second sequential subcircuit to the second internal input of the second sequential subcircuit.

10. The circuit of claim 2, wherein:
    the flip-flop subcircuit comprises a d-type flip-flop;
    the external input is a data input of the d-type flip-flop; and
    the external output is a data output of the d-type flip-flop.

11. A device comprising:
    a memory comprising at least one flip-flop circuit, the flip-flop circuit comprising:
      an external input;
      an external output;
      a first sequential subcircuit for reading data-input signals from the external input, the first sequential subcircuit comprising:
        a first internal input coupled to the external input; and
        a first internal output;
      a second sequential subcircuit for outputting data-output signals to the external output, the second sequential subcircuit comprising:
        a second internal input coupled to the first internal output of the first sequential subcircuit; and
        a second internal output coupled to the external output; and
      a hysteresis subcircuit coupled to the external output, the hysteresis subcircuit being configured to reduce a short-circuit current of the flip-flop circuit; and
    a physical processor coupled to the memory.

12. The device of claim 11, wherein the hysteresis subcircuit comprises:
    a first transistor comprising:
      a first gate coupled to the second sequential subcircuit;
      a first source coupled to the external output; and
      a first drain coupled to a ground; and a second transistor comprising;
  a second gate coupled to the second sequential subcircuit;
  a second source coupled to the external output; and
  a second drain coupled to a positive supply signal.

13. The device of claim 12, wherein:
the first transistor comprises a p-type transistor; and
the second transistor comprises an n-type transistor.

14. The device of claim 12, wherein the first gate of the first transistor and the second gate of the second transistor are coupled to the second internal input of the second sequential subcircuit.

15. The device of claim 12, further comprising:
  a first inverter coupling the second internal output of the second sequential subcircuit to the external output; and
  a second inverter coupling the second internal output of the second sequential subcircuit to the first gate of the first transistor and the second gate of the second transistor.

16. The device of claim 12, further comprising:
  a clocked inverter coupling the external input to the first internal input of the first sequential subcircuit; and
  a transmission gate coupling the first internal output of the first sequential subcircuit to the second internal input of the second sequential subcircuit.

17. The device of claim 12, wherein the first sequential subcircuit comprises:
  an inverter coupling the first internal input of the first sequential subcircuit to the first internal output of the first sequential subcircuit; and
  a clocked inverter coupling the first internal output of the first sequential subcircuit to the first internal input of the first sequential subcircuit.

18. The device of claim 12, wherein the second sequential subcircuit comprises:
  an inverter coupling the second internal input of the second sequential subcircuit to the second internal output of the second sequential subcircuit; and
  a clocked inverter coupling the second internal output of the second sequential subcircuit to the second internal input of the second sequential subcircuit.

19. The device of claim 11, wherein:
the flip-flop subcircuit comprises a d-type flip-flop;
the external input is a data input of the d-type flip-flop; and
the external output is a data output of the d-type flip-flop.

20. A method comprising:
coupling an internal output of a first sequential subcircuit to an internal input of a second sequential subcircuit, wherein:
  the first sequential subcircuit is configured to read data-input signals from an external input; and
  the second sequential subcircuit is configured to output data-output signals to an external output; and
coupling a hysteresis subcircuit to the external output, the hysteresis subcircuit being configured to reduce a short-circuit current of one or more of the first sequential subcircuit and the second sequential subcircuit.

* * * * *